(12) United States Patent
Ohda et al.

(10) Patent No.: US 11,749,667 B2
(45) Date of Patent: Sep. 5, 2023

(54) SEMICONDUCTOR MANUFACTURING APPARATUS

(71) Applicant: Kioxia Corporation, Tokyo (JP)

(72) Inventors: Toshihiko Ohda, Yokkaichi (JP); Tetsuya Kurosawa, Yokkaichi (JP); Masatoshi Fukuda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 305 days.

(21) Appl. No.: 17/233,937

(22) Filed: Apr. 19, 2021

(65) Prior Publication Data

US 2021/0242191 A1    Aug. 5, 2021

Related U.S. Application Data

(62) Division of application No. 16/125,996, filed on Sep. 10, 2018, now Pat. No. 11,024,619.

(30) Foreign Application Priority Data

Mar. 20, 2018   (JP) .............................. JP2018-053369

(51) Int. Cl.
*H01L 25/065* (2023.01)
*H01L 21/66* (2006.01)
*H01L 25/00* (2006.01)
*H01L 23/00* (2006.01)

(52) U.S. Cl.
CPC .............. *H01L 25/50* (2013.01); *H01L 22/20* (2013.01); *H01L 24/75* (2013.01); *H01L 24/81* (2013.01);

(Continued)

(58) Field of Classification Search
CPC ..... H01L 25/50; H01L 25/0657; H01L 22/20; H01L 2224/7565; H01L 2224/75753;
(Continued)

(56) References Cited

U.S. PATENT DOCUMENTS 8,893,953 B2    11/2014   Lee
9,070,715 B2     6/2015   Shin
(Continued)

FOREIGN PATENT DOCUMENTS

JP    2008-41733    2/2008
JP    4761326       8/2011
(Continued)

*Primary Examiner* — Timor Karimy
(74) *Attorney, Agent, or Firm* — Oblon, McClelland, Maier & Neustadt, L.L.P.

(57) ABSTRACT

A semiconductor manufacturing method of mounting a semiconductor chip or a stacked body of semiconductor chips on a support substrate placed on a stage, determines whether a predetermined condition is satisfied during a mounting processing of the semiconductor chip or the stacked body, evacuates, together with the support substrate, the semiconductor chip or the stacked body that has mounted on the support substrate before the determination when it is determined that the predetermined condition is satisfied, determines whether to resume the mounting processing of the semiconductor chip or the stacked body after the evacuation; and returns the evacuated semiconductor chip or the evacuated stacked body to a position before the evacuation and continuing the mounting processing when it is determined that the mounting processing is resumed.

10 Claims, 16 Drawing Sheets

(52) U.S. Cl.
CPC .... *H01L 25/0657* (2013.01); *H01L 2224/759* (2013.01); *H01L 2224/7565* (2013.01); *H01L 2224/7598* (2013.01); *H01L 2224/75753* (2013.01); *H01L 2224/8113* (2013.01); *H01L 2224/81908* (2013.01); *H01L 2224/81986* (2013.01); *H01L 2225/06513* (2013.01); *H01L 2225/06562* (2013.01); *H01L 2225/06565* (2013.01)

(58) Field of Classification Search
CPC ....... H01L 2224/759; H01L 2224/7598; H01L 2224/8113; H01L 2224/81908; H01L 2224/81986; H01L 2225/06513; H01L 2225/06562; H01L 2225/06565; H01L 24/75; H01L 24/81; H10B 80/00
See application file for complete search history.

(56) References Cited

U.S. PATENT DOCUMENTS

| | | |
|---|---|---|
| 9,448,065 B2 | 9/2016 | Fukayama et al. |
| 9,673,166 B2 | 6/2017 | Nishimura et al. |
| 10,217,676 B2 | 2/2019 | Fukayama et al. |
| 2008/0025823 A1 | 1/2008 | Harumoto |
| 2012/0295028 A1 | 11/2012 | Zenitani |

FOREIGN PATENT DOCUMENTS

| | | |
|---|---|---|
| JP | 2016-62958 | 4/2016 |
| TW | 201711085 A | 3/2017 |
| WO | WO 2006/118018 A1 | 11/2006 |
| WO | WO 2015/079991 A1 | 6/2015 |

SEMICONDUCTOR MANUFACTURING APPARATUS

CROSS REFERENCE TO RELATED APPLICATIONS

This application is a divisional of U.S. application Ser. No. 16/125,996 filed Sep. 10, 2018, which is based upon and claims the benefit of priority from the prior Japanese Patent Application No. 2018-53369, filed on, Mar. 20, 2018, the entire contents of each of which are incorporated herein by reference.

FIELD

Embodiments described herein relate generally to a semiconductor manufacturing method, a semiconductor manufacturing apparatus, and a semiconductor device.

BACKGROUND

In order to achieve compactness and high functionality of a semiconductor device, semiconductor devices having a SiP (System in Package) structure in which a plurality of semiconductor chips are stacked and sealed in one package have been put to practical use. In a semiconductor device with the SiP structure, it is required to transmit and receive electric signals between semiconductor chips at high speed. In such a case, a microbump is often used for electrical connection between semiconductor chips. The microbump is a projection having a pitch of about 10 to 100 μm and a diameter of about 5 to 50 μm and is formed by soldering or the like on one side or both sides of the semiconductor chip. Generally, when stacking semiconductor chips on which microbumps are formed, the microbumps are aligned with each other, and the upper and lower semiconductor chips are pressed and connected while applying heat.

For some reason, when the apparatus that stacks the semiconductor chips is stopped, the semiconductor chips are continuously heated on a stage on which the semiconductor chips are stacked. In this case, by heating, the solder of the microbump on the semiconductor chip continues to be oxidized, and an oxide film is excessively formed. When the oxide film is excessively formed on the surface of the microbump, a connection defect such as no connection between microbumps occurs.

DETAILED DESCRIPTION

According to one embodiment a semiconductor manufacturing method of mounting a semiconductor chip or a stacked body of semiconductor chips on a support substrate placed on a stage, the method has:

determining whether a predetermined condition is satisfied during a mounting processing of the semiconductor chip or the stacked body;

evacuating, together with the support substrate, the semiconductor chip or the stacked body that has mounted on the support substrate before the determination when it is determined that the predetermined condition is satisfied;

determining whether to resume the mounting processing of the semiconductor chip or the stacked body after the evacuation; and returning the evacuated semiconductor chip or the evacuated stacked body to a position before the evacuation and continuing the mounting processing when it is determined that the mounting processing is resumed.

Terms such as "parallel", "orthogonal", "same" and the like, values of length and angle, and the like which specify shapes and geometrical conditions and their degrees to be used in this specification are interpreted including a range in which these terms can be expected to have similar functions without being bound by a strict meaning.

First Embodiment

Figure 1:
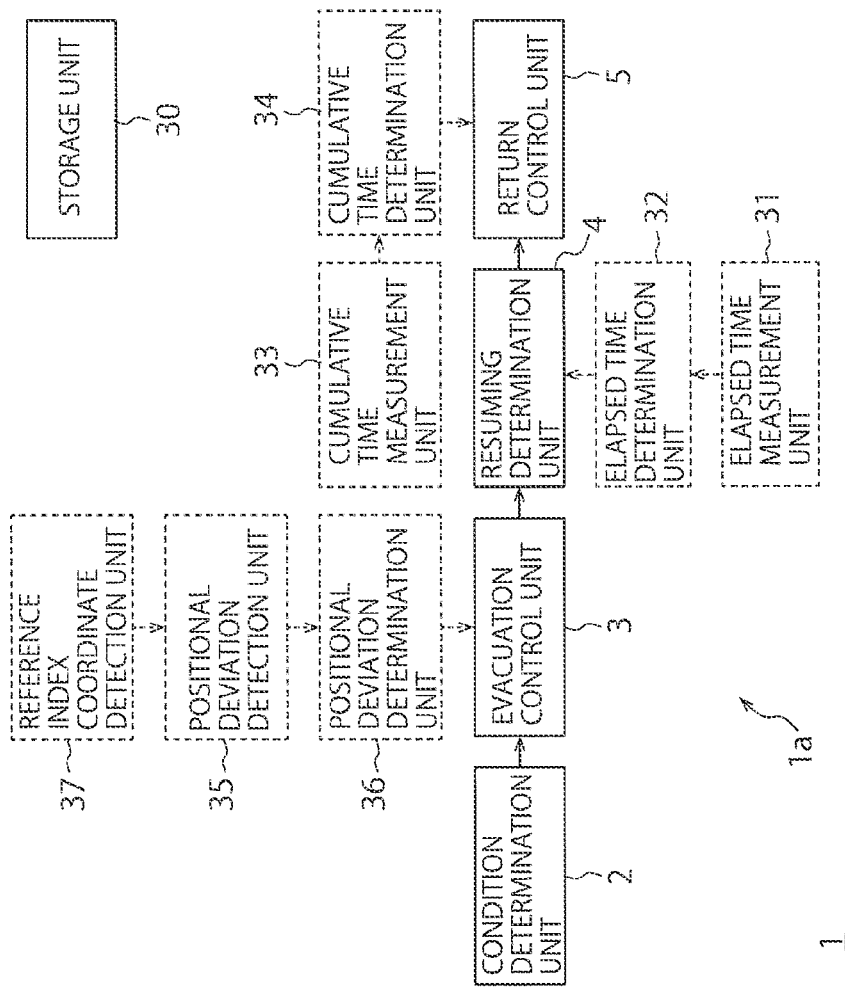
FIG. 1 is a block diagram showing a schematic configuration of a control device of a semiconductor manufacturing apparatus according to a first embodiment.

A semiconductor manufacturing apparatus 1 according to a first embodiment includes a control device 1a that controls the semiconductor manufacturing apparatus 1. FIG. 1 is a block diagram showing a schematic configuration of the control device 1a of the semiconductor manufacturing apparatus 1 according to the first embodiment. With the semiconductor manufacturing apparatus 1 according to the present embodiment, a stacked body with a plurality of semiconductor chips stacked on a support substrate placed on a stage is produced. The produced stacked body is housed in one package as described later. The control device 1a in FIG. 1 includes a condition determination unit (condition determinator) 2, an evacuation control unit (evacuation controller) 3, a resuming determination unit (resuming determinator) 4, and a return control unit (return controller) 5.

The condition determination unit 2 determines whether a predetermined condition is satisfied while mounting the plurality of semiconductor chips on the stage. For example, the condition determination unit 2 determines whether to stop the mounting processing while mounting of a plurality of semiconductor chips. Stopping of the mounting processing can be caused by various factors. For example, in some cases, an apparatus performing the mounting processing stops for some reason. There are cases where the apparatus stops due to the apparatus itself such as a failure of the apparatus, the apparatus stops due to an environmental condition such as an abnormality of the environmental temperature, and an operator intentionally stops the apparatus. Here, an apparatus that performs mounting processing is a generic term for apparatuses used for stacking a plurality of semiconductor chips, and includes, for example, a die bonding device, a camera used for alignment, a heater for heating the semiconductor chip, a head for transporting the semiconductor chip on a stage, and a transport unit (transporter) for evacuating the semiconductor chip, and the like.

When it is determined that the mounting processing is stopped, the evacuation control unit 3 evacuates a group of semiconductor chips which has been stacked before the determination. A transport unit to be described later is used for evacuating the group of semiconductor chips. The group of semiconductor chips may include the support substrate, in addition to a plurality of semiconductor chips.

The resuming determination unit 4 determines whether to resume the mounting processing after stopping the mounting processing. The resuming determination unit 4 resumes the mounting processing when there is no cause to stop the mounting processing. For example, the mounting processing is resumed when the apparatus that is to perform the mounting processing starts operating after stopping once.

When it is determined by the resuming determination unit 4 that the mounting processing is to be resumed, the return control unit 5 returns the group of evacuated semiconductor chips to a position before evacuation and continues the mounting processing. In this manner, the return control unit 5 reuses the group of semiconductor chips that has been temporarily evacuated while being mounted without discarding them, to form a stacked body including the group of semiconductor chips of the initially planned stack number.

In addition, the control device 1a of FIG. 1 may include an elapsed time measurement unit (elapsed time measurer) 31 and an elapsed time determination unit (elapsed time determiner) 32. The elapsed time measurement unit 31 measures a time elapsed after the support substrate on which the semiconductor chip or the stacked body is mounted has been transported onto the stage on which the mounting processing is performed or a time elapsed after the semiconductor chip or the stacked body has been mounted on the stage. The elapsed time determination unit 32 determines whether the elapsed time measured by the elapsed time measurement unit 31 is not less than a first set time. When it is determined that the elapsed time measured by the elapsed time measurement unit 31 is not less than the first set time, the evacuation control unit evacuates the semiconductor chip or the stacked body.

In addition, the control device 1a in FIG. 1 may include a cumulative time measurement unit (cumulative time measurer) 33 and a cumulative time determination unit (cumulative time determiner) 34. The cumulative time measurement unit 33 measures a time elapsed after the apparatus performing the mounting processing stopped. The cumulative time determination unit 34 determines whether the cumulative time measured by the cumulative time measurement unit 33 is within a second set time. When the cumulative time measured by the cumulative time measurement is within the second set time, the return control unit returns the semiconductor chip or the stacked body to a position before evacuation and continues the mounting processing, and when the cumulative time exceeds the second set time, transport the semiconductor chip or the stacked body out.

In addition, the control device 1a of FIG. 1 may include a positional deviation detection unit (positional deviation detector) 35 and a positional deviation determination unit (positional deviation determiner) 36. The positional deviation detection unit 35 detects the amount of positional deviation between the mounting coordinate on the semiconductor chip stacked last and the reference coordinate on the semiconductor chip stacked immediately before the last stacked semiconductor chip among the stacked semiconductor chips. The positional deviation determination unit 36 determines whether the amount of positional deviation detected by the positional deviation detection unit 35 is within a predetermined range. When it is determined that the apparatus performing the mounting processing stops, the evacuation control unit evacuates the group of semiconductor chips after detecting the amount of positional deviation by the positional deviation detection unit 35, and when it is determined by the positional deviation determination unit 36 that the amount of positional deviation exceeds the predetermined range, evacuates the group of semiconductor chips and performs a predetermined warning processing.

In addition, the control device 1a of FIG. 1 may include a reference index coordinate detection unit (reference index coordinate detector) 37. The reference index coordinate detection unit 37 detects the coordinates of a first reference index and a second reference index. In the first reference index, the support substrate for supporting on the stage the lowermost semiconductor chip among the group of semiconductor chips or the stacked body, or the lowermost semiconductor chip is provided at a position that can be visually recognized from above the support substrate when stacking the group of semiconductor chips. In the second reference index, the lowermost semiconductor chip is provided at a position that is invisible from above the support substrate when stacking the group of semiconductor chips. In this case, the positional deviation detection unit 35 detects the amount of positional deviation between the mounting coordinate on the semiconductor chip stacked on m-th (m is an integer of 2 or more) step and the reference coordinate based on the second reference index.

FIGS. 2A to 2G are cross-sectional views showing a process sequence of stacking a plurality of semiconductor chips. As shown in these figures, the apparatus that performs mounting processing includes a stage 11, a camera 12 and a head 13, and a transport unit (transporter) 14. A support substrate 15 is placed on the stage 11, and a plurality of semiconductor chips 16 is stacked on the support substrate 15. During the mounting processing, a microbump 18 bonded to a pad 17 of the semiconductor chip 16 is subjected to heat treatment. The camera 12 is used for aligning the pad 17 with the microbump 18 of the plurality of semiconductor chips 16 to be stacked. The positional relationship between an alignment mark 19 and the pad 17, and the positional relationship between the alignment mark 19 and the microbump 18 are stored in the apparatus in advance, and the periphery of the alignment mark 19 on each semiconductor chip 16 is photographed and recognized by the camera 12 to perform position alignment. The head 13 with the semiconductor chip 16 to be stacked next in a state of being attached thereto is transported and mounting is performed.

The transport unit 14 is one of the features of this embodiment and is used for evacuating, together with the support substrate 15, a group of semiconductor chips 20 which is being mounted. The transport unit 14 is evacuated outside of the stage 11 in a state where the group of semiconductor chips 20 is attached to the support substrate 15. The evacuation destination is a place not affected by the temperature on the stage 11. By evacuating the group of semiconductor chips 20 by the transport unit 14, there is no possibility that the group of semiconductor chips 20 will continue to be heated on the stage 11, for example, when the apparatus stops, and oxidation of the microbump 18 can be suppressed.

Figure 3:
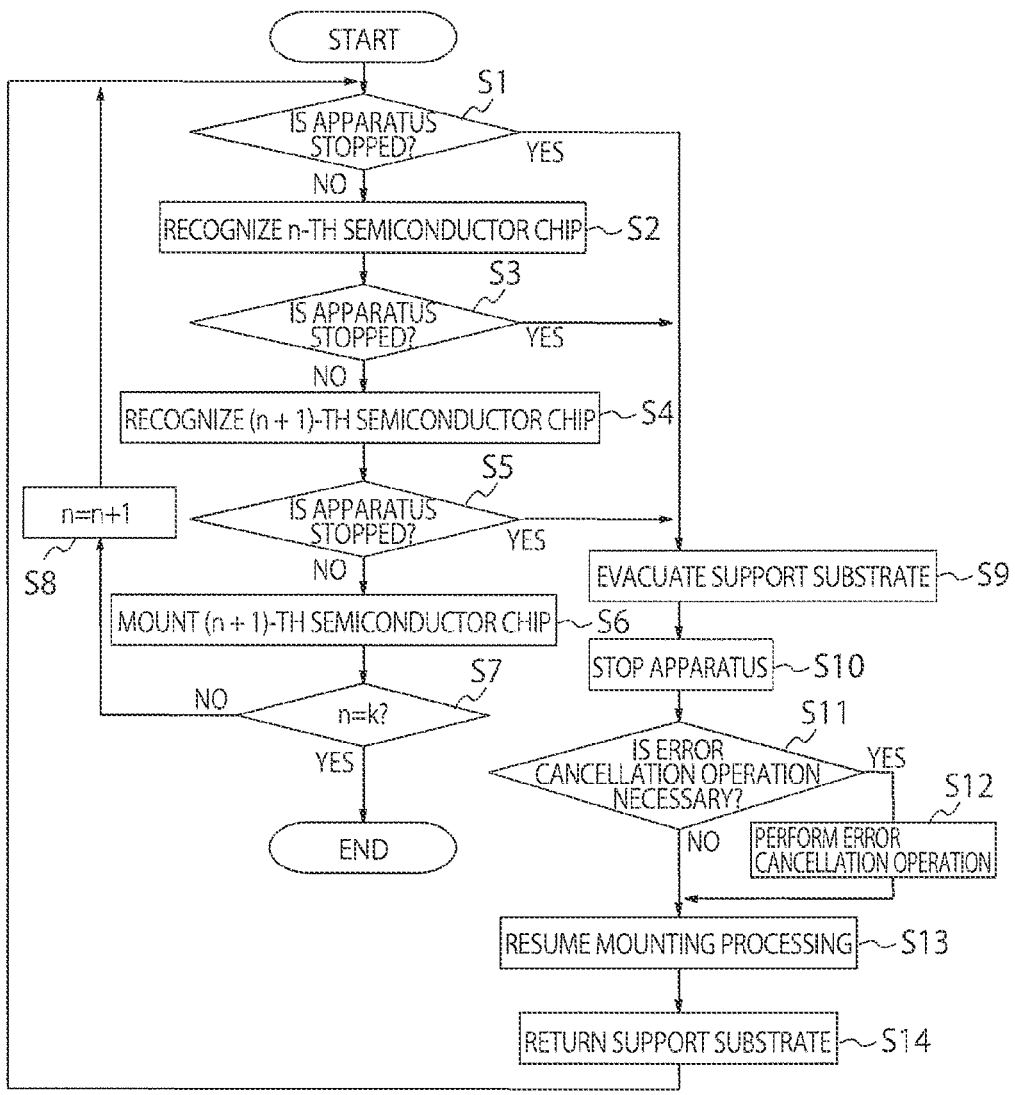
FIG. 3 is a flowchart showing the processing operation of the semiconductor manufacturing apparatus according to the first embodiment.

FIG. 3 is a flowchart showing the processing operation of the semiconductor manufacturing apparatus 1 according to the first embodiment. This flowchart shows a processing operation of mounting the semiconductor chip 16 on the (n+1)-th (n is an integer not less than 1) step after mounting the semiconductor chip 16 on the n-th step.

First, the condition determination unit 2 determines whether the apparatus performing the mounting processing stops (step S1). Here, determination is made based on the value of a flag indicating that the apparatus performing the mounting processing is stopped.

For example, when the flag with 1 means the apparatus is stopped, even if the flag is 1, the apparatus may not actually be stopped actually. When a process to be described later instructs the apparatus to stop, the apparatus stops upon receiving the instruction.

When it is determined in step S1 that the apparatus does not stop, the camera 12 recognizes the alignment mark 19 on the semiconductor chip 16 on the n-th step (step S2). Next, the condition determination unit 2 determines again whether the apparatus performing the mounting processing stops (step S3). When it is determined that the apparatus is not stopped, the camera 12 recognizes the semiconductor chip 16 on the (n+1)-th step (step S4).

Figure 2A:
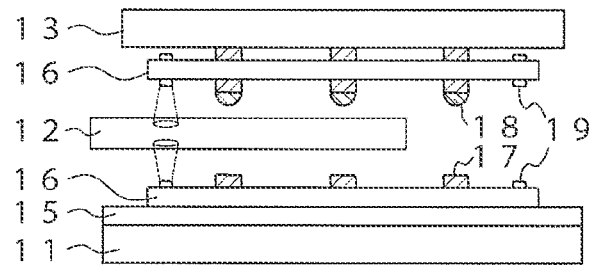
FIG. 2A is a cross-sectional view showing a process sequence of stacking a plurality of semiconductor chips.

Here, as shown in FIG. 2A, the semiconductor chip 16 on the (n+1)-th step is attached by the head 13 and transported, and the alignment mark 19 on the semiconductor chip 16 on the n-th step and the alignment mark 19 on the semiconductor chip 16 on the (n+1)-th step are photographed and recognized by the camera 12, and position alignment is performed. Note that FIG. 2A shows a state in which the camera 12 is disposed between the semiconductor chip 16 on the n-th step and the semiconductor chip 16 on the (n+1)-th step to photograph and recognize the alignment mark 19 of both semiconductor chips 16. However, the alignment marks 19 of both the semiconductor chips 16 are not necessarily photographed and recognized at the same timing. For example, after photographing and recognizing the alignment mark 19 of the semiconductor chip 16 on the n-th step, the alignment mark 19 of the semiconductor chip 16 on the (n+1)-th step may be photographed and recognized. Alternatively, the alignment mark 19 of each semiconductor chip 16 may be photographed and recognized in the reverse order. Alternatively, it may be photographed and recognized at the same timing. Also, when photographing and recognizing at the same timing, it is possible to omit determining whether the apparatus in step S3 stops.

Figure 2B:
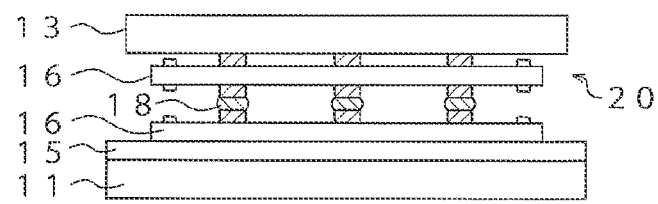
FIG. 2B is a process cross-sectional view following FIG. 2A.
Figure 2C:
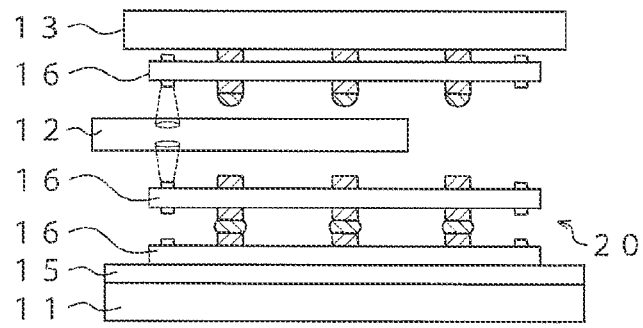
FIG. 2C is a cross-sectional view of the process following FIG. 2B.
Figure 2D:
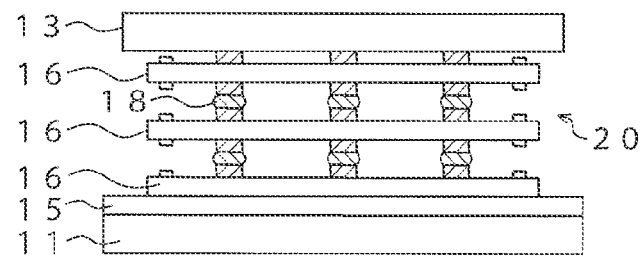
FIG. 2D is a process cross-sectional view following FIG. 2C.

Next, it is determined again whether the apparatus performing the mounting processing stops (step S5). When it is determined that the apparatus is not stopped, the semiconductor chip 16 on the (n+1)-th step is transported onto the stage 11 and mounted on the semiconductor chip 16 on the n-th step (step S6). In mounting, as shown in FIG. 2B, the head 13 is lowered to bring the microbump 18 on the semiconductor chip 16 on the (n+1)-th step into contact with the pad 17 on the semiconductor chip 16 on the n-th step, and they are attached by press-bonding while heat or ultrasonic waves is applied. Next, it is determined whether the number of stacked semiconductor chips 16 reaches a predetermined number k (step S7). When it has not reached the predetermined number k yet, n is incremented by 1 (step S8), and the processing after step S1 is repeated. FIG. 2C shows a state of positioning the semiconductor chip 16 of the next step, and FIG. 2D shows a state of mounting the semiconductor chip 16 of that step. When it is determined in step S7 that the predetermined number k has been reached, the process ends.

Figure 2E:
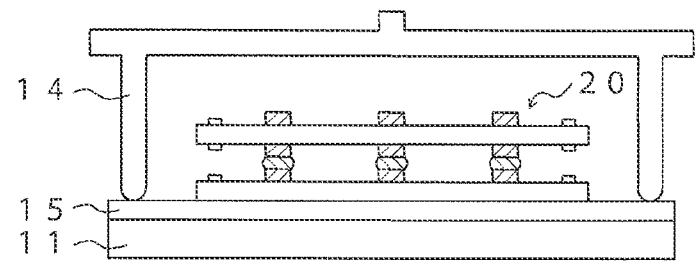
FIG. 2E is a process cross-sectional view following FIG. 2D.

When it is determined that the apparatus performing the mounting processing is stopped in steps S1, S3 or S5, the evacuation control unit 3 causes the transport unit 14 to evacuate together with the support substrate 15 the group of semiconductor chips 20 which has been stacked before the determination (step S9). When the transport unit 14 evacuates the group of semiconductor chips 20 to the evacuation destination, the apparatus is stopped while the group of semiconductor chips 20 is attached (step S10). FIG. 2E shows a state in which the transport unit 14 is attached to the support substrate 15.

Figure 2F:
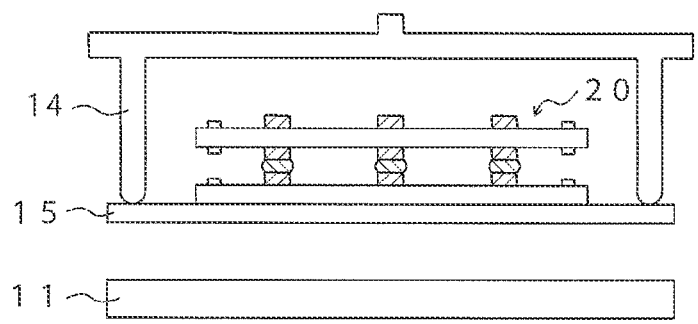
FIG. 2F is a process cross-sectional view following FIG. 2E.

Since the group of stacked semiconductor chips 20 is placed on the support substrate 15, the transport unit 14 can transport the support substrate 15 and the group of semiconductor chips collectively. In addition, FIG. 2F shows a state in which the group of semiconductor chips 20 and the support substrate 15 which are attached by the transport unit 14 are lifted above the stage 11.

Figure 2G:
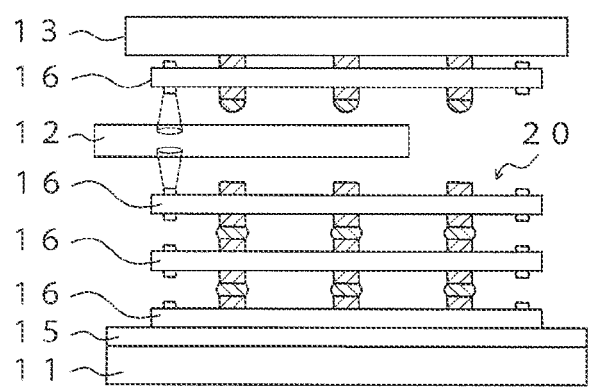
FIG. 2G is a process cross-sectional view following FIG. 2F.

Next, it is determined whether an error cancellation operation is necessary (step S11). When it is determined that an error cancellation operation is required, an error cancellation operation is performed (step S12), and when it is determined that there is no need for an error cancellation operation, it is determined that the mounting processing is resumed, and the return control unit 5 resume the mounting processing (step S13). Here, the evacuated group of semiconductor chips 20 is returned to a position before evacuation by the transport unit 14 (step S14). After that, as shown in FIG. 2G, a new semiconductor chip 16 is continuously stacked on the group of semiconductor chips 20 which is being mounted. Note that in FIG. 2G, for example, after photographing and recognizing the alignment mark 19 of the semiconductor chip 16 arranged below the camera 12, the alignment mark 19 of the semiconductor chip 16 arranged above the camera 12 is photographed and recognized. Alternatively, the alignment mark 19 may be photographed and recognized in the reverse order. Alternatively, it may be photographed and recognized at the same timing.

As described above, in the first embodiment, when an apparatus that performs the mounting processing stops due to some reasons while the semiconductor chip 16 is mounted, the group of semiconductor chips 20 which is being mounted is evacuated by the transport unit 14 from the stage 11. Therefore, the semiconductor chip 16 is not heated on the stage 11 due to the stoppage of the apparatus, so that the acceleration of oxidation of the microbump 18 on the semiconductor chip 16 can be suppressed and the connection failure of the microbump 18 will not occur.

Second Embodiment

In the second embodiment, when a predetermined set time has elapsed since the semiconductor chip 16 or the support substrate 15 was transported onto the stage 11, they are evacuated.

While the control device 1a of the semiconductor manufacturing apparatus 1 according to the second embodiment has the same block configuration as that of FIG. 1, the processing operation of the condition determination unit 2 and the evacuation control unit 3 is different from that of the first embodiment.

The condition determination unit 2 of the second embodiment performs a process of measuring a time elapsed after the semiconductor chip 16 or the support substrate 15 has been transported onto the stage 11, and a process of determining whether the elapsed time is not less than the first set time, or, measuring the cumulative time remaining on the stage 11 to determine whether the cumulative time (hereinafter, stage retention cumulative time) is not less than the second set time. Further, when it is determined that the elapsed time is not less than the first set time or the stage retention cumulative time is not less than the second set time, the evacuation control unit 3 of the second embodiment evacuates the group of semiconductor chips 20 which is being mounted.

Figure 4:
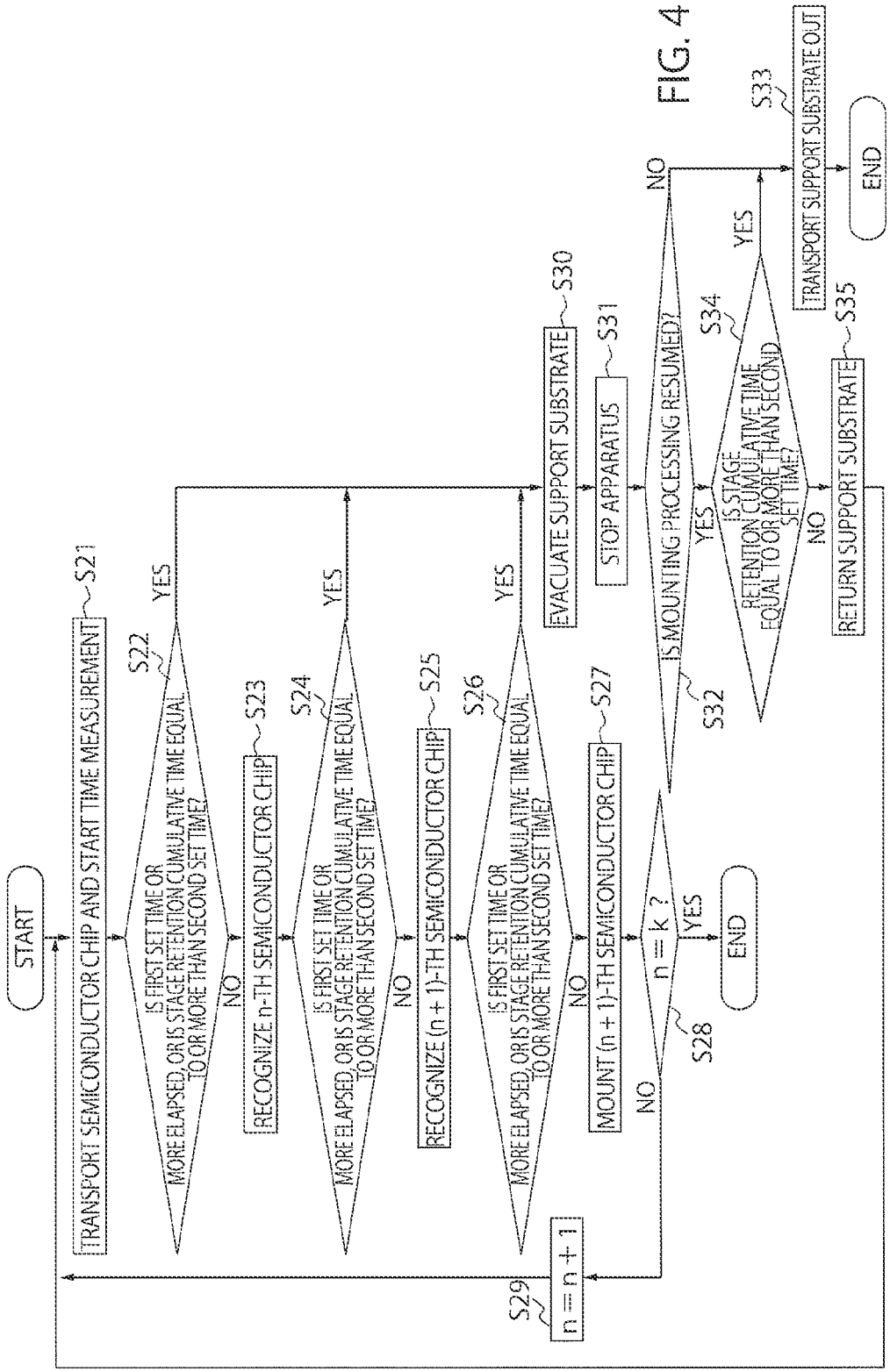
FIG. 4 is a flowchart showing the processing operation of the semiconductor manufacturing apparatus according to a second embodiment.

FIG. 4 is a flowchart showing the processing operation of the semiconductor manufacturing apparatus 1 according to the second embodiment. Hereinafter, differences from the flowchart of FIG. 3 will be mainly described. First, immediately after the predetermined operation, time measurement is started (step S21, elapsed time measurement unit 31). The predetermined operation means transporting the semiconductor chip 16 on the n-th step transported by the transporting head 13 onto the stage 11, transporting the support substrate 15 onto the stage 11, and the like. Next, it is determined whether the elapsed time after the predetermined operation is not less than the first set time or whether the stage retention cumulative time is not less than the second set time (step 22, elapsed time determination unit 32). When it is determined to be "NO" in step S22, the alignment mark 19 of the semiconductor chip 16 on the n-th step is recognized by the camera 12 (step S23).

Next, it is determined again whether a time elapsed after the semiconductor chip 16 on the n-th step or the support substrate has been transported onto the stage 11 is not less than the first set time or whether the stage retention cumulative time is not less than the second set time (step S24, elapsed time determination unit 32) again. When it is determined to be "NO" in step S24, the camera 12 recognizes the alignment mark 19 of the semiconductor chip 16 on the (n+1)-th step transported by the head 13 (step S25).

Next, it is determined again whether a time elapsed after the semiconductor chip 16 on the n-th step has been transported onto the stage 11 is not less than the first set time or whether the stage retention cumulative time is not less than the second set time (step S26, elapsed time determination unit 32). When it is determined to be "NO" in step S26, the semiconductor chip 16 on the (n+1)-th step is transported onto the stage 11 and mounted on the semiconductor chip 16 on the n-th step (step S27). Next, it is determined whether the number of stacked semiconductor chips 16 has reached a predetermined number k (step S28). When the predetermined number k has not been reached yet, n is incremented by 1 (step S29), and the processing after step S21 is repeated.

When it is determined to be "YES" in the step S22, S24 or S26, the group of semiconductor chips 20 which is being mounted is evacuated by using the transport unit 14 (step S30), and the apparatus is stopped (step S31).

Thereafter, it is determined whether to resume the mounting processing (step S32). When the mounting processing is not resumed, the group of semiconductor chips 20 in the middle of transfer is transported out using the transport unit 14 (step S33). In the case of resuming, the cumulative time that each semiconductor chip 16 included in the group of semiconductor chips 20 which is being mounted remains on the stage 11 is measured, and it is determined whether the cumulative time is within the second set time (step S34). When the cumulative time is within the second set time, the evacuated group of semiconductor chips 20 is returned to a position before evacuation by the transport unit 14 (step S35). When the cumulative time exceeds the second set time, the process proceeds to step S33 to perform the transport process.

As described above, in the second embodiment, when a time elapsed after each semiconductor chip 16 or the support substrate 15 has been transported onto the stage 11 is not less than the first set time, or the stage retention cumulative time is not less than the second set time, the group of semiconductor chips 20 which is being mounted is evacuated by the transport unit 14. Thus, the group of semiconductor chips 20 which is being mounted does not stay on the stage 11 for such a long time that the microbumps 18 of the semiconductor chip 16 is oxidized excessively, whereby poor connection of the microbumps 18 can be prevented.

Third Embodiment

In the third embodiment, when a predetermined set time has elapsed since the apparatus performing the mounting processing is stopped, the group of semiconductor chips 20 which is being mounted is evacuated.

While the control device 1a of the semiconductor manufacturing apparatus 1 according to the third embodiment has the same block configuration as that of FIG. 1, the processing operation of the condition determination unit 2 and the evacuation control unit 3 is different from that of the first embodiment.

The condition determination unit 2 of the third embodiment performs a process of measuring a time elapsed after the apparatus performing the mounting processing has been stopped and a process of determining whether the elapsed time is not less than the first set time, or, determining whether the stage retention cumulative time is not less than the second set time. Further, when it is determined that the elapsed time is not less than the first set time or the stage retention cumulative time is not less than the second set time, the evacuation control unit 3 of the third embodiment evacuates the group of semiconductor chips 20.

Figure 5:
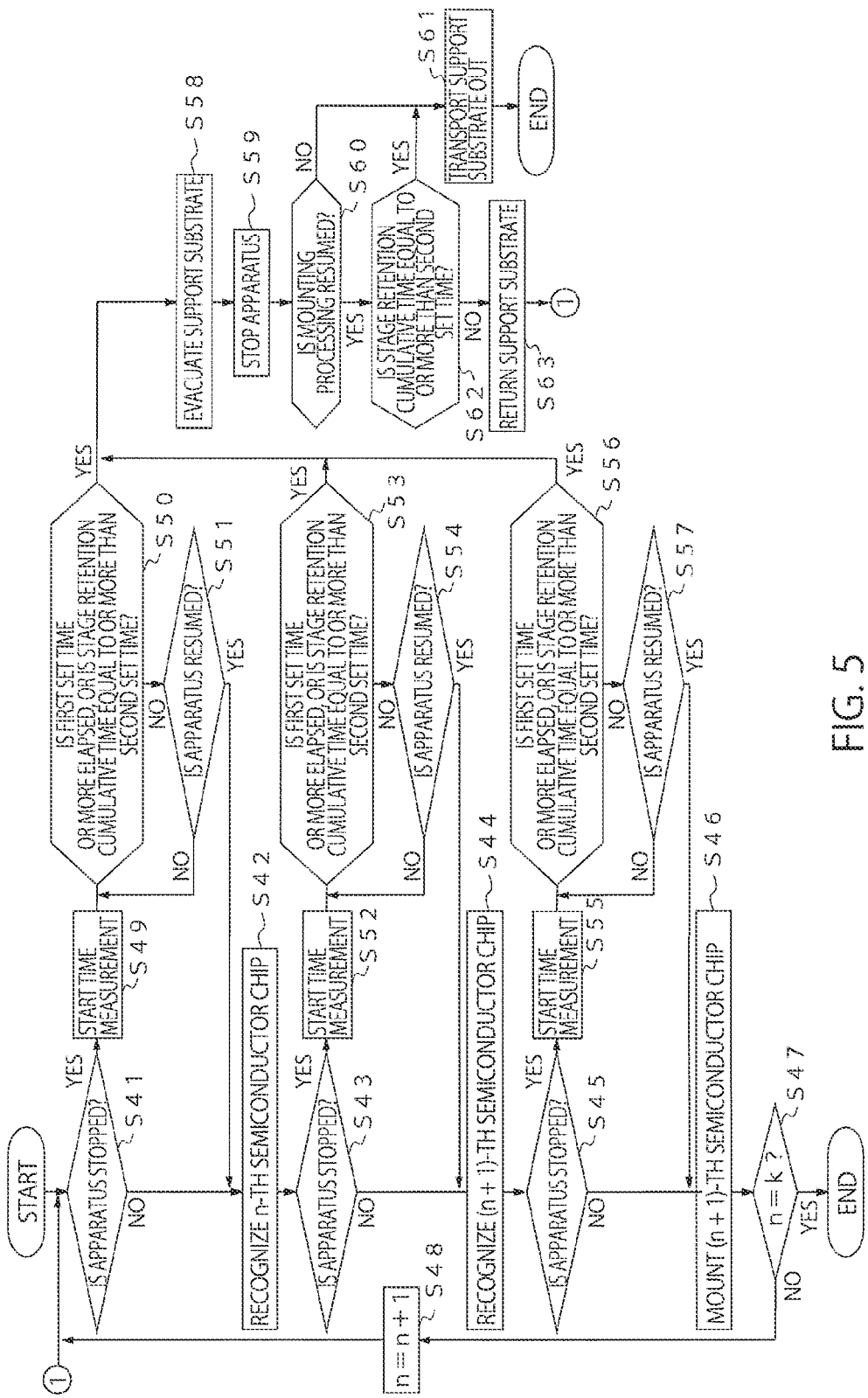
FIG. 5 is a flowchart showing the processing operation of the semiconductor manufacturing apparatus according to a third embodiment.

FIG. 5 is a flowchart showing the processing operation of the semiconductor manufacturing apparatus 1 according to the third embodiment. Hereinafter, differences from the flowchart of FIG. 4 will be mainly described. First, it is determined whether the apparatus performing the mounting processing stops (step S41). As in step S1 of FIG. 3, here, the determination is made based on the value of a flag indicating that the apparatus performing the mounting processing is stopped. Therefore, at the time when it is determined in step S41 that the apparatus is stopped, the apparatus may not be stopped yet.

When it is determined in step S41 that the apparatus is not stopped, next, the alignment mark 19 of the semiconductor chip 16 on the n-th step is recognized by the camera 12 (step S42). Next, it is again determined whether the apparatus performing the mounting processing stops (step S43). When it is determined that the apparatus is not stopped, the camera 12 recognizes the semiconductor chip 16 on the (n+1)-th step attached and transported by the head 13 (step S44). Next, it is determined again whether the apparatus performing the mounting processing stops (step S45). When it is determined that the apparatus is not stopped, the semiconductor chip 16 on the (n+1)-th step is then transported onto the stage 11 and mounted on the semiconductor chip 16 on the n-th step (step S46). Next, it is determined whether the number of stacked semiconductor chips 16 has reached a predetermined number k (step S47). When the predetermined number k has not been reached yet, n is incremented by 1 (step S48), and the processing after step S41 is repeated.

When it is determined that the apparatus has stopped in steps S41, S43 or S45, time measurement is started (steps S49, S52, S55, elapsed time measurement unit 31). It is determined whether a time elapsed after the time measurement has been started is not less than the first set time or whether the stage retention cumulative time is not less than the second set time (steps S50, S53, S56, elapsed time determination unit 32). When it is determined to be "NO" in steps S50, S53 or S56, it is determined whether the apparatus has resumed operation (steps S51, S54, S57). When the apparatus does not resume operation, the process returns to steps S50, S53 or S56. When the apparatus resumes operation, the process proceeds to step S42, S44 or S46. When it is determined to be "YES" in steps S50, S53 or S56, the group of semiconductor chips 20 which is being mounted is evacuated by the transport unit 14 (step S58), and the apparatus is stopped (step S59). The subsequent processing (steps S60 to S63, cumulative time measurement unit 33, cumulative time determination unit 34) is the same as steps S32 to S35 in FIG. 4.

As described above, in the third embodiment, when a time elapsed after the apparatus performing the mounting processing has been stopped is not less than the first set time or the stage retention cumulative time is not less than the second set time, the group of semiconductor chips 20 which is being mounted is evacuated by the transport unit 14, so that it is possible to prevent a problem that the semiconductor chip 16 is continuously heated on the stage 11 while the apparatus is stopped.

Fourth Embodiment

In the fourth embodiment, when it is determined that the mounting processing is to be stopped, the mounting positional deviation of the semiconductor chip 16 stacked last is detected, and then the group of semiconductor chips 20 which is being mounted is evacuated.

While the control device 1a of the semiconductor manufacturing apparatus 1 according to the fourth embodiment has the same block configuration as that of FIG. 1, the processing operation of the condition determination unit 2 for evacuation is different from that of the first embodiment. The condition determination unit 2 of the fourth embodiment performs a process of detecting the amount of positional deviation between the mounting coordinate on a semiconductor chip 16 stacked last and the reference coordinate on a semiconductor chip 16 stacked just before the last stacked semiconductor chip 16 among the group of semiconductor chips 20, and determining whether the amount of detected positional deviation is within the predetermined range. When it is determined that the mounting processing is stopped, after detecting the amount of mounting positional deviation by the condition determination unit 2, the evacuation control unit 3 evacuates the group of semiconductor chips 20. Furthermore, when the amount of detected positional deviation exceeds the predetermined range, predetermined warning processing is performed.

Figure 6:
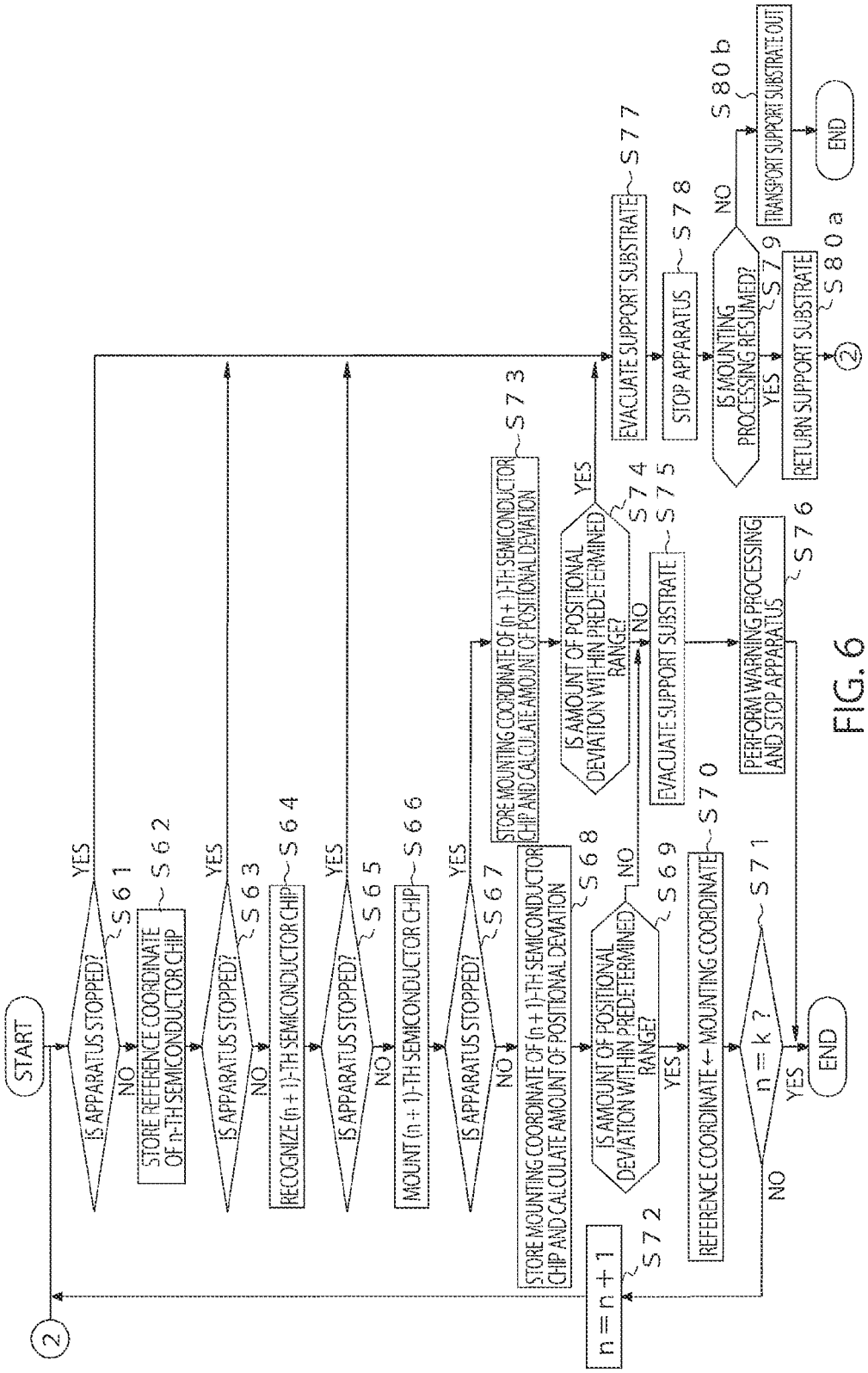
FIG. 6 is a flowchart showing the processing operation of the semiconductor manufacturing apparatus according to a fourth embodiment.

FIG. 6 is a flowchart showing the processing operation of the semiconductor manufacturing apparatus 1 according to the fourth embodiment. Hereinafter, differences from the flowchart of FIG. 3 will be mainly described. First, it is determined whether the apparatus performing the mounting processing stops (step S61). When it is determined that the apparatus is not stopped, the alignment mark 19 of the semiconductor chip 16 on the n-th step is recognized by using the camera 12, and the coordinates are stored in a storage unit (memory) 30 (step S62). The alignment mark 19 is, for example, positioned on the diagonal line of the semiconductor chip 16 on the n-th step, and its coordinates are (Xna, Yna) and (Xnb, Ynb). The center coordinate (Xn, Yn) of (Xna, Yna) and (Xnb, Ynb) is defined as the reference coordinate and stored in the storage unit 30. The reference coordinate is used to detect the amount of positional deviation from the semiconductor chip on the (n+1)-th step to be mounted next. In the storage unit 30, a total of three points of the coordinates of two points on the diagonal line and the reference coordinate at the center are stored.

Next, it is determined again whether the apparatus performing the mounting processing stops (step S63). When it is determined that the apparatus does not stop, the camera 12 recognizes the alignment mark 19 of the semiconductor chip 16 on the (n+1)-th step (step S64). Next, it is determined again whether the apparatus performing the mounting processing stops (step S65). When it is determined that the apparatus does not stop, the semiconductor chip 16 on the (n+1)-th step is mounted (step S66). Next, it is determined again whether the apparatus performing the mounting processing stops (step S67). When it is determined that the apparatus does not stop, the camera 12 recognizes the alignment mark 19 of the semiconductor chip 16 on the (n+1)-th step with the chip 16 mounted.

These coordinates are stored in the storage unit 30 (step S68, positional deviation detection unit 35). The alignment mark 19 is disposed, for example, diagonally on the semiconductor chip 16 on the (n+1)-th step, and its coordinates are (Xn+1a, Yn+1a) and (Xn+1b, Yn+1b). The center coordinate (Xn+1, Yn+1) of (Xn+1a, Yn+1a) and (Xn+1b, Yn+1b) is defined as the mounting coordinate and stored in the storage unit 30. The mounting coordinate is used to detect the amount of positional deviation from the semiconductor chip 16 on the n-th step. In this manner, the mounting coordinate is the coordinate of the center of two diagonal points on the uppermost semiconductor chip 16, which is the calculation target of the amount of positional deviation. In addition, the reference coordinate is the coordinate of the center of two diagonal points on the semiconductor chip 16 serving as a reference for calculating the amount of positional deviation.

Next, the amount of positional deviation which is a difference between the above-described reference coordinate and the mounting coordinate is calculated, and it is determined whether the amount of positional deviation is within a predetermined range (step S69, positional deviation determination unit 36). When the amount of positional deviation is within the predetermined range, it is determined that the standard is satisfied, and the coordinates of the two points on the semiconductor chip 16 on the (n+1)-th step stored in step S68 and the mounting coordinate of the center thereof are stored as, for example, the coordinates of two points serving as the reference when mounting the semiconductor chip 16 on the (n+2)-th step to be mounted next and the reference coordinate of the center thereof (step S70). That is, the coordinates are stored in such manners as (Xna←Xn+1a, Yna←Yn+1a), (Xnb←Xn+1b, Ynb←Yn+1b), and (Xn1←Xn+1, Yn←Yn+1).

Here, the amount of positional deviation can be represented by information of (X, Y, θ). Among them, (X, Y) can be calculated by recognizing two points on semiconductor chips 16 on the n-th step and the (n+1)-th step, comparing the coordinates of the midpoints thereof and calculating a difference. Further, the θ deviation amount may be calculated by the intersection angle between the lines connecting the alignment marks of the above-described two points on the semiconductor chips 16 on the n-th step and the (n+1)-th step.

Next, it is determined whether the number of stacked semiconductor chips 16 reaches a predetermined number k (step S71). When the number k has not been reached yet, n is incremented by 1 (step S72), and the processing after step S61 is repeated.

When it is determined in step S67 that the apparatus has stopped, before the group of semiconductor chips 20 which is being mounted is evacuated, the alignment mark 19 of the semiconductor chip 16 on the (n+1)-th step is recognized using the camera 12, and the coordinates are stored in the storage unit 30 (step S73, positional deviation detection unit 35). The alignment mark 19 is disposed, for example, diagonally on the semiconductor chip 16 on the (n+1)-th step, and its coordinates are (Xn+1a, Yn+1a) and (Xn+1b, Yn+1b). The center coordinate (Xn+1, Yn+1) of (Xn+1a, Yn+1a) and (Xn+1b, Yn+1b) is stored as the mounting coordinate. In step S73, as in step S68, the amount of positional deviation (X, Y) between the mounting coordinate of the semiconductor chip 16 on the (n+1)-th step and the reference coordinate of the semiconductor chip 16 on the n-th step, and the amount of positional deviation (θ) calculated by the intersection angle between the line segments connecting the two alignment marks of each semiconductor chip 16 are calculated. A deviation between positions of the group of semiconductor chips 20 before and after evacuation occurs due to the mechanical accuracy of the apparatus even if the group of semiconductor chips 20 is once returned to the original position after evacuated. Therefore, when mounting the semiconductor chip 16 on the (n+1)-th step, evacuating the group of semiconductor chips 20 before calculating the amount of positional deviation, and returning the semiconductor chip 16 to the original position to calculate the amount of positional deviation, an error is generated by a transport deviation in the result of the mounting positional deviation detection, because the positional deviation between the reference coordinate on the n-th step before evacuation and the mounting coordinate on the (n+1)-th step after evacuation is calculated.

On the other hand, when calculating the amount of positional deviation before evacuation, it is possible to calculate the amount of positional deviation without being affected by the transport deviation.

Next, it is determined whether the amount of positional deviation is within a predetermined range (step S74, positional deviation determination unit 36). When it is determined in step S69 or S74 that the amount of positional deviation is outside of the predetermined range, the group of semiconductor chips 20 which is being mounted is evacuated by the transport unit 14 (step S75). Thereafter, predetermined warning processing is performed, and the apparatus is stopped (step S76).

When it is determined that the apparatus has stopped in steps S61, S63 or S65, or when it is determined in step S74 that the amount of positional deviation is within the predetermined range, the group of semiconductor chips 20 which is being mounted is evacuated by the transport unit 14 (step S77) and the apparatus is stopped (step S78). Thereafter, it is determined whether to resume the mounting processing (step S79). When resuming, a process of returning the evacuated group of semiconductor chips 20 to the position before evacuation is performed (step S80a). When not resumed, the group of semiconductor chips 20 is transported out (step S80b).

As described above, in the fourth embodiment, before evacuating the group of semiconductor chips 20 which is being mounted, the amount of positional deviation between the semiconductor chip 16 stacked last and the semiconductor chip 16 stacked immediately before the last stack is calculated and stored, and thereafter evacuated. Thus, after the group of semiconductor chips 20 is returned to the original position after evacuation, the positional deviation can be accurately detected without being affected by the transport deviation, so that the stacking process is continuously performed with high accuracy. In the fourth embodiment, when the amount of positional deviation (X, Y) between the mounting coordinate on the last semiconductor chip 16 stacked last and the reference coordinate on the semiconductor chip 16 stacked immediately before the last stack, and the amount of positional deviation (θ) calculated by the intersection angle between the line segments connecting the two alignment marks of each semiconductor chips 16 are not within the predetermined range, the group of semiconductor chips 20 which is being mounted is evacuated and a warning processing is performed, so that it is possible to quickly detect the positional deviation at the time of stacking and to suppress defects from occurring.

Fifth Embodiment

In the fifth embodiment, for example, the semiconductor chips on the (n+1) step and subsequent steps are stacked and the positional deviation is detected, with reference to the alignment mark 19 on the lowermost semiconductor chip 16.

While the control device 1a of the semiconductor manufacturing apparatus 1 according to the fifth embodiment has the same block configuration as that of FIG. 1, the processing operation of the condition determination unit 2 and the evacuation control unit 3 is different from that of the first embodiment.

The condition determination unit 2 of the fifth embodiment performs a process of detecting, among the m stacked semiconductor chips 16, the amount of positional deviation (X, Y) between the reference coordinate on the semiconductor chip 16 stacked on the lowermost semiconductor chips 16 or the n-th step (n is an integer of 1 or more and less than m) and the mounting coordinate on the semiconductor chip 16 stacked on the m-th step, and the amount of positional deviation (θ) calculated by the intersection angle between the line segments connecting the two alignment marks of each semiconductor chip 16, and a process of determining whether the amount of detected positional deviation is within a predetermined range. In the fifth embodiment, when it is determined that the mounting processing is stopped, after detecting the amount of mounting positional deviation by the condition determination unit 2, the evacuation control unit 3 evacuates the group of semiconductor chips 20. Furthermore, when the amount of detected positional deviation exceeds the predetermined range, predetermined warning processing is performed.

Figure 7:
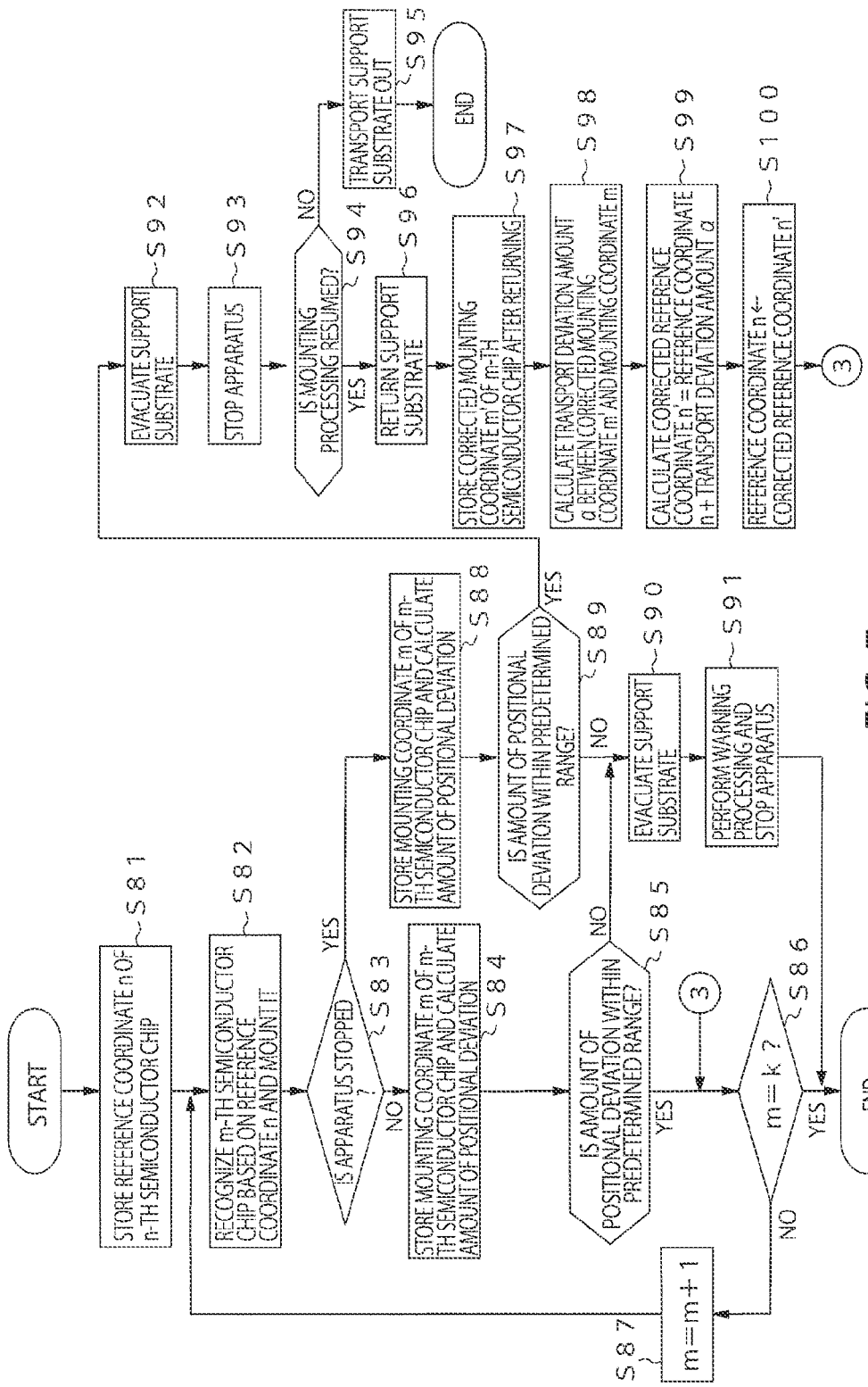
FIG. 7 is a flowchart showing the processing operation of the semiconductor manufacturing apparatus according to a fifth embodiment.

FIG. 7 is a flowchart showing the processing operation of the semiconductor manufacturing apparatus 1 according to the fifth embodiment. Hereinafter, differences from the flowchart of FIG. 6 will be mainly described. First, the camera 12 recognizes the alignment mark 19 of semiconductor chip 16 on the n-th (n is an integer not less than 1) step, and the coordinates of the alignment mark 19 are stored in the storage unit 30 (step S81). The alignment mark 19 is disposed, for example, diagonally on the semiconductor chip 16 on the n-th step, and its coordinates are (Xna, Yna) and (Xnb, Ynb). The center coordinate (Xn, Yn) of (Xna, Yna) and (Xnb, Ynb) is stored as the reference coordinate n.

Next, the semiconductor chip 16 on the m-th step is recognized and mounted based on the reference coordinate n (step S82). Here, the semiconductor chip 16 on the m-th step is mounted until m=k where 1≤n≤m≤k (step S86). For each step, the alignment mark 19 of the semiconductor chip 16 is photographed and recognized by the camera 12, and then it is determined whether the apparatus is stopped. When the apparatus does not stop, the alignment mark 19 is recognized by the camera, and the process of mounting the semiconductor chip 16 is repeated.

Next, it is determined whether the apparatus performing the mounting processing stops (step S83). When the apparatus does not stop, the alignment mark 19 of the semiconductor chip 16 on the m-th step is recognized by the camera 12, the coordinates of the alignment mark 19 are stored in the storage unit 30, and the amount of positional deviation from the semiconductor chip 16 on the n-th step is calculated (step S84, positional deviation detection unit 35). The alignment mark 19 is disposed, for example, diagonally on the semiconductor chip 16 on the m-th step and its coordinates are (Xma, Yma) and (Xmb, Ymb). The center coordinate (Xm, Ym) of (Xma, Yma) and (Xmb, Ymb) is stored as the mounting coordinate m.

Next, it is determined whether the amount of positional deviation is within a predetermined range (step S85, positional deviation determination unit 36). When the amount of positional deviation is within the predetermined range, it is determined whether m equals the set number k (step S86). When m<k, m is incremented by 1 (step S87), and the processing after step S82 is repeated.

When it is determined in step S83 that the apparatus has stopped, the alignment mark 19 is recognized using the camera 12 of the semiconductor chip 16 on the m-th step, the coordinates of the alignment mark 19 are stored in the storage unit 30, and the amount of positional deviation from semiconductor chip 16 on the n-th step is calculated (step S88, positional deviation detection unit 35). In step S88, as in step S73 of FIG. 6, since the amount of positional deviation of the uppermost semiconductor chip 16 is calculated before the group of semiconductor chips 20 is evacuated, it is possible to calculate the positional deviation without being affected by the transport deviation after the evacuation of the group of semiconductor chips 20.

Next, it is determined whether the amount of positional deviation is within a predetermined range (step S89, positional deviation determination unit 36). When it is determined in step S85 or S89 that the amount of positional deviation is outside of the predetermined range, the group of semiconductor chips 20 which is being mounted is evacuated by the transport unit 14 (step S90), and predetermined warning processing is performed and the apparatus is stopped (step S91).

When it is determined in step S89 that the amount of positional deviation is within the predetermined range, the group of semiconductor chips 20 which is being mounted is evacuated by the transport unit 14 (step S92), and the apparatus is stopped (step S93).

Next, it is determined whether to continue the mounting processing (step S94). When the mounting processing is not continued, the group of semiconductor chips 20 which is being mounted is transported out by the transport unit 14 (step S95). In the case of continuing the mounting processing, the group of semiconductor chips 20 which is being mounted is returned to the position before evacuation by the transport unit 14 (step S96). Next, after returning the group of semiconductor chips 20 to the original position, the alignment mark 19 of the semiconductor chip 16 on the m-th step is recognized by the camera 12, and the coordinates are stored (step S97). The alignment mark 19 is disposed, for example, diagonally on the semiconductor chip 16 on the m-th step, and its coordinates are (Xm'a, Ym'a) and (Xm'b, Ym'b). The center coordinate (Xm', Ym') of (Xm'a, Ym'a) and (Xm'b, Ym'b) is stored as the corrected mounting coordinate m'.

Next, the transport deviation amounts aa and ab between the coordinates (Xm'a, Ym'a) and (Xm'b, Ym'b) of the semiconductor chip 16 on the m-th step after returning the group of semiconductor chips 20 to the original position and the coordinates (Xma, Yma) and (Xmb, Ymb) of the semiconductor chip 16 before evacuation are calculated (step S98). The transport deviation amounts are (Xαa=Xm'a−Xma, Yαa=Ym'a−Yma) and (Xαb=Xm'b−Xmb, Yαb=Ym'b−Ymb).

Next, the coordinates obtained by adding the transport deviation amounts aa and ab to the coordinates of the semiconductor chip 16 on the n-th step on the stage 11 are stored in the storage unit 30 (step S99). The coordinates are (Xn'a=Xna+Xαa, Yn'a=Yna+Yαa), (Xn'b=Xnb+Xαb, Yn'b=Ynb+Yαb). The center coordinate (Xn', Yn') of (Xn'a, Yn'a) and (Xn'b, Yn'b) is stored as the corrected reference coordinate n'.

Next, the reference coordinate n used in the process of steps S81 to S88 is replaced with the corrected reference coordinate n'(step S100). Thereafter, the processes after step S86 are performed.

As described above, in the fifth embodiment, the reference coordinate when stacking the group of semiconductor chips 20 are, for example, the alignment mark 19 of the lowermost semiconductor chip 16, so that even if the semiconductor chips 16 are stacked in multiple steps, a problem that the amount of positional deviation increases cumulatively does not occur. In particular, in the fifth embodiment, when the group of semiconductor chips 20 is returned to the original position after the group of semiconductor chips 20 in the middle of stacking is evacuated, the transport deviation amount of the uppermost semiconductor chip 16 is calculated, and based on the transport deviation amount, the reference coordinate of the lowermost semiconductor chip 16 is corrected, so that it is possible to carry out the stacking process with high accuracy with reference to the lowermost semiconductor chip 16 without being affected by the transport deviation after returning the semiconductor chip 16 to the original position.

Sixth Embodiment

In the sixth embodiment, another alignment mark 21 is provided at a position which can be recognized by the camera 12 at any time.

While the control device 1a of the semiconductor manufacturing apparatus 1 according to the sixth embodiment has the same block configuration as that of FIG. 1, the processing operation of the condition determination unit 2 and the evacuation control unit 3 is different from that of the first embodiment.

The condition determination unit 2 of the sixth embodiment performs a process of detecting, among the m stacked semiconductor chips 16, the amount of positional deviation between the reference coordinate on the lowermost semiconductor chips 16 or the n-th step (n is an integer of 1 or more and less than m) semiconductor chips 16 and the reference coordinate on the semiconductor chip 16 stacked on the m-th step, and a process of determining whether the amount of detected positional deviation is within a predetermined range. In the sixth embodiment, after detecting the amount of mounting positional deviation by the condition determination unit 2, the evacuation control unit 3 evacuates the group of semiconductor chips 20. Furthermore, when the amount of detected positional deviation exceeds the predetermined range, predetermined warning processing is performed.

Figure 8A:
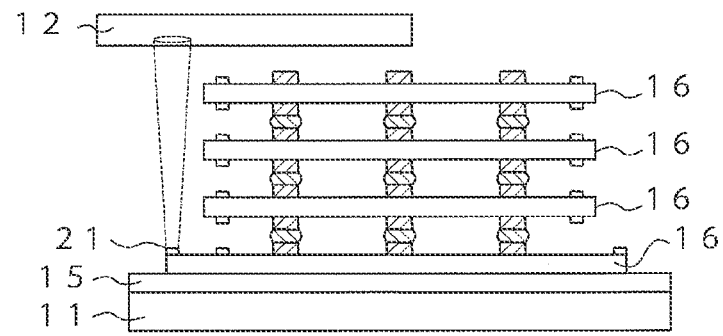
FIG. 8A is a side view of a group of semiconductor chips stacked on a support substrate.
Figure 8B:
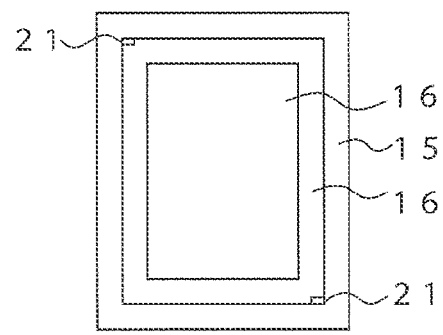
FIG. 8B is a view of the group of semiconductor chips as seen from above.

FIGS. 8A and 8B are a view of the alignment marks 21 additionally provided on the semiconductor chip 16 on the first step. FIG. 8A is a side view of the group of semiconductor chips 20 stacked on the support substrate 15, and FIG. 8B is a view as seen from above. The semiconductor chip 16 on the first step has a larger area than the semiconductor chips 16 on the second and subsequent steps. The above-described alignment marks 21 are arranged so as not to vertically overlap with the semiconductor chips 16 on the second and subsequent steps. Therefore, when the camera 12 is disposed above as shown in FIG. 8A, regardless of the number of stacked semiconductor chips 16, the camera 12 can recognize the alignment mark 21 at any time. FIG. 8B shows an example in which the alignment marks 21 are provided at two places on the diagonal line of the semiconductor chip 16 on the first step. The alignment mark 21 is not necessarily limited to being arranged diagonally as shown in FIG. 8B.

Figure 9A:
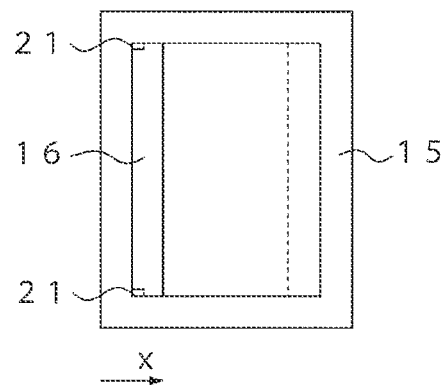
FIG. 9A is a diagram in which a semiconductor chip on the first step is shifted in the X direction.
Figure 9B:
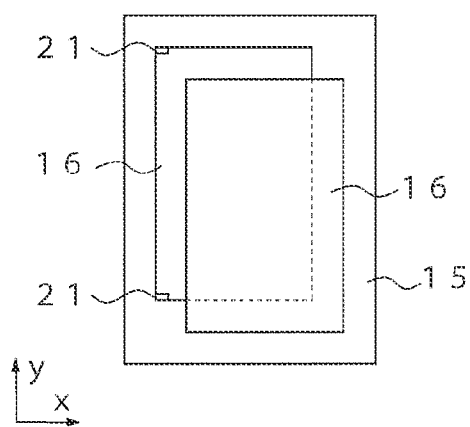
FIG. 9B is a diagram in which the semiconductor chip on the first step is shifted in the X direction and the Y direction.

For example, FIGS. 9A to 9D are diagrams showing various modified examples in which the alignment marks 21 are arranged. In FIG. 9A, although the semiconductor chip 16 on the first step has the same area as the semiconductor chips 16 on the second and subsequent steps, the first step semiconductor chip is shifted in the X direction, and by the shifting, the alignment marks 21 are provided at two places where the semiconductor chip 16 on the first step does not vertically overlap with the semiconductor chips 16 on the second and subsequent steps. In FIG. 9B, although the semiconductor chip 16 on the first step has the same area as the semiconductor chips 16 on the second and subsequent steps, the first step semiconductor chip is shifted in the X direction and the Y direction, and by the shifting, the alignment marks 21 are provided at two places where the semiconductor chip 16 on the first step does not vertically overlap with the semiconductor chips 16 on the second and subsequent steps.

Figure 9C:
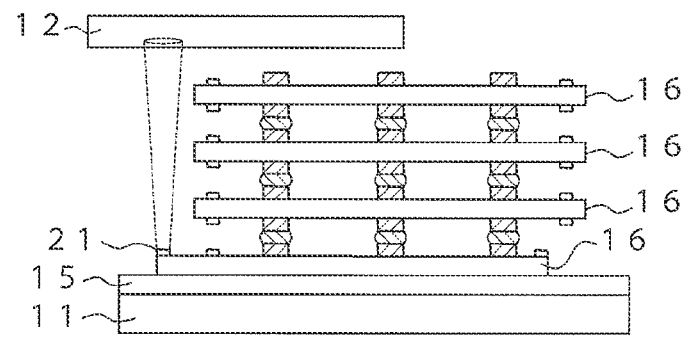
FIG. 9C is a diagram in which an alignment mark provided on the lowermost semiconductor chip corresponding to FIGS. 9A and 9B is recognized by a camera.

In both FIGS. 9A and 9B, as shown in FIG. 9C, when arranging the camera 12 above, it is possible to recognize the alignment mark 21 without being affected by the semiconductor chips 16 on the second and subsequent steps.

Figure 9D:
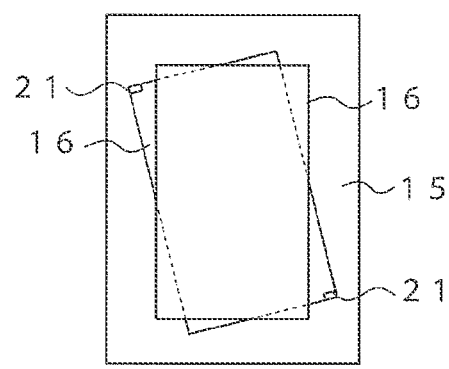
FIG. 9D is a diagram in which the arrangement angle of the semiconductor chip on the first step is caused to be different from the arrangement angle of semiconductor chips on the second and subsequent steps.

Alternatively, as shown in FIG. 9D, although the semiconductor chip 16 on the first step has the same area as the semiconductor chips 16 on the second and subsequent steps, the arrangement angle of the semiconductor chip 16 on the first step may be different from the arrangement angle of the semiconductor chips 16 on the second and subsequent steps.

In addition, the above-described alignment mark 21 is not necessarily provided in the semiconductor chip 16 on the first step, and it may be arranged on the support substrate 15 that supports the multi-step group of semiconductor chips 20.

Figure 10A:
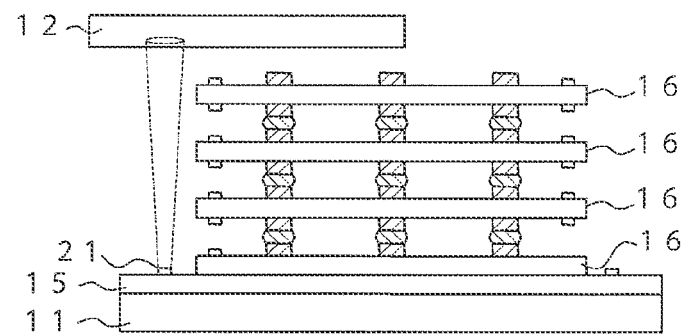
FIG. 10A is a diagram showing an example in which an alignment mark is provided on a support substrate.
Figure 10B:
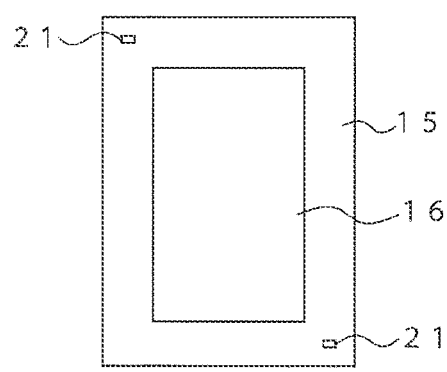
FIG. 10B is a plan view corresponding to FIG. 10A.

FIGS. 10A and 10B show an example in which the alignment marks 21 are provided on the support substrate 15. The support substrate 15 supports the group of semiconductor chips 20, and in many cases has a larger installation area than the group of semiconductor chips 20. Therefore, by arranging the alignment marks 21 so as not to vertically overlap with the group of semiconductor chips 20 on the support substrate 15, the alignment marks 21 can be recognized by the camera 12 at any time.

Figure 11:
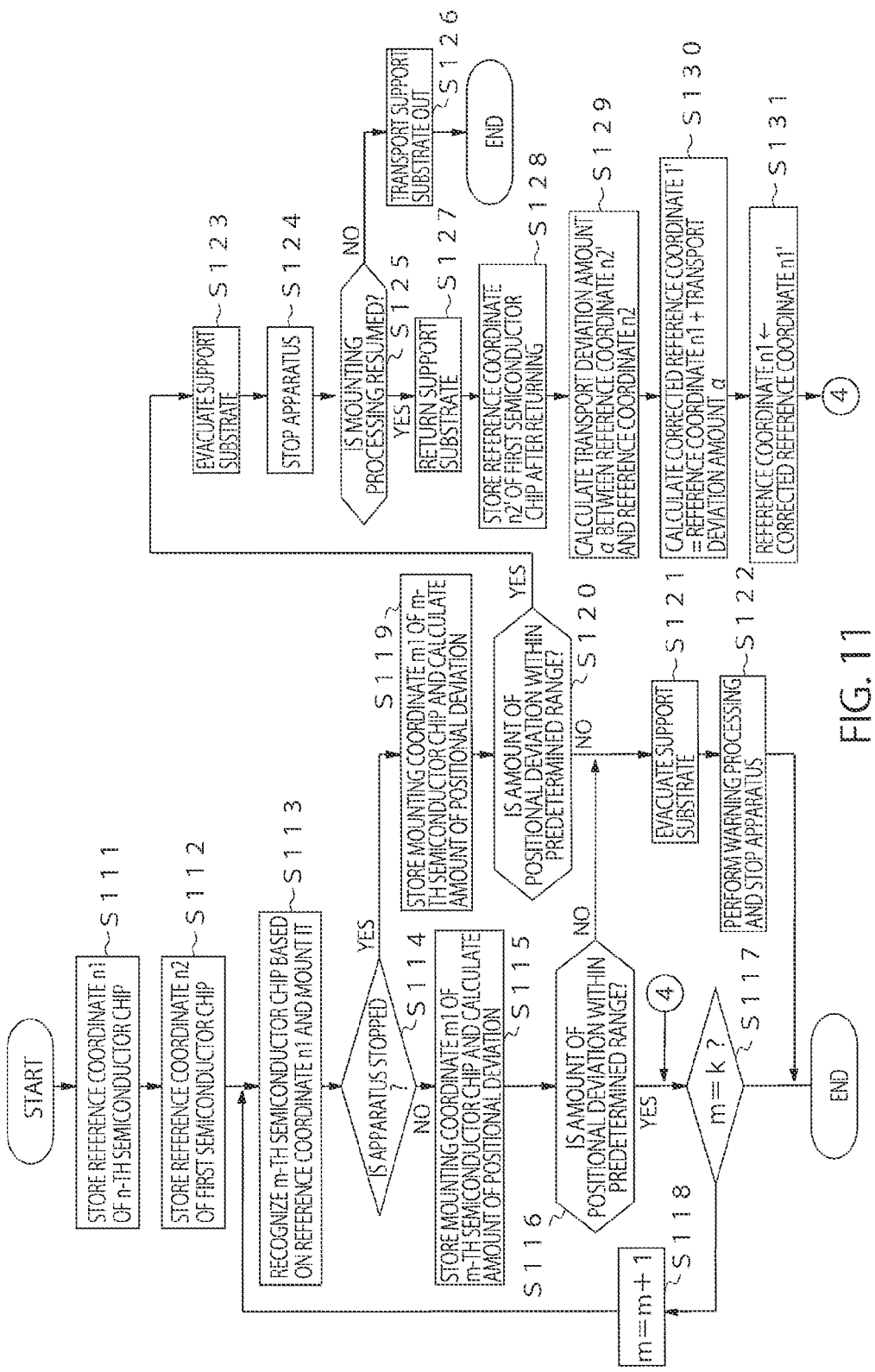
FIG. 11 is a flowchart showing the processing operation of the semiconductor manufacturing apparatus according to a sixth embodiment.
Figure 12A:
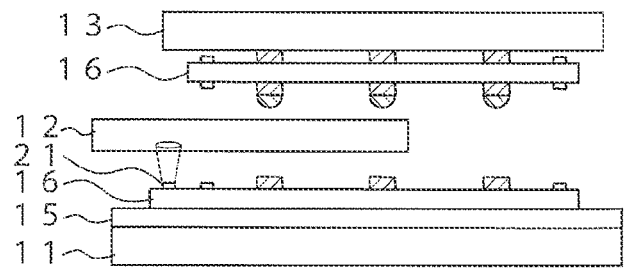
FIG. 12A is a diagram in which an alignment mark provided on the lowermost semiconductor chip or the support substrate is recognized by a camera.
Figure 12B:
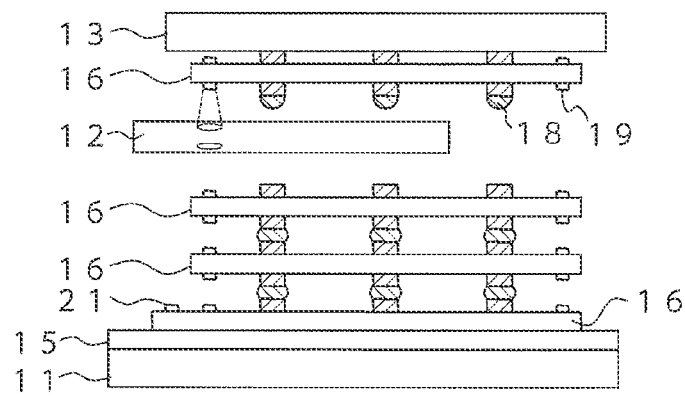
FIG. 12B is a diagram showing a state in which an alignment mark on the back surface of a semiconductor chip to be stacked therefrom is photographed and recognized by a camera in order to be aligned with the lowermost semiconductor chip.
Figure 12C:
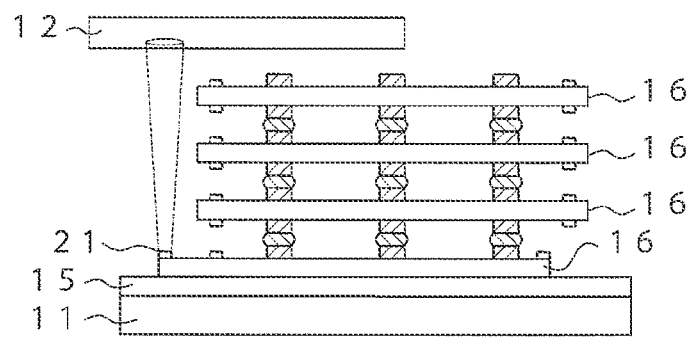
FIG. 12C is a diagram showing a state in which the group of semiconductor chips has been returned to its original position after evacuation.

FIG. 11 is a flowchart showing the processing operation of the semiconductor manufacturing apparatus 1 according to the sixth embodiment. Hereinafter, differences from the flowchart of FIG. 6 will be mainly described. FIGS. 12A to 12C are diagrams showing how the semiconductor chips 16 are stacked.

First, the camera 12 recognizes the alignment mark (second reference index) 19 of the lowermost semiconductor chip 16 or the semiconductor chips 16 on the n-th (n is an integer not less than 1) step, and their coordinates are stored in the storage unit 30 (step S111). The alignment mark 19 is disposed, for example, diagonally on the semiconductor chip 16 on the n-th step, and its coordinates are (Xna1, Yna1) and (Xnb1, Ynb1). The center coordinate (Xn1, Yn1) of (Xna1, Yna1) and (Xnb1, Ynb1) is stored as the reference coordinate n1.

Next, as shown in FIG. 12A, the camera 12 recognizes the alignment mark (first reference index) 21 provided on the lowermost semiconductor chip 16, the semiconductor chip 16 on the n-th step, or the support substrate 15, and these coordinates are stored in the storage unit 30 (step S112). The coordinates of the alignment mark 21 are, for example, on the semiconductor chip 16 on the n-th step, and the coordinates thereof are (Xna2, Yna2) and (Xnb2, Ynb2). The center coordinate (Xn2, Yn2) of (Xna2, Yna2) and (Xnb2, Ynb2) is stored as the reference coordinate n2.

Next, the semiconductor chip 16 on the m-th step is recognized and mounted based on the reference coordinate n1 (step S113). Here, the semiconductor chip 16 on the m-th step is mounted until m=k where 1≤n≤m≤k. More specifically, as shown in FIG. 12B, the coordinates of the alignment mark 19 of the stored lowermost semiconductor chip 16 and the alignment mark 19 on the back side of the semiconductor chip 16 to be stacked are photographed and recognized by the camera 12, and the position alignment is performed using the coordinates of the recognized position. Then it is determined whether the apparatus is stopped. When the apparatus does not stop, the alignment mark 19 is recognized by the camera 12, and the process of mounting the semiconductor chip 16 Is repeated.

Next, it is determined whether the apparatus performing the mounting processing stops (step S114). When it is determined that the apparatus is not stopped, the camera 12 recognizes the alignment mark 19 of the semiconductor chip 16 on the m-th step, and the coordinates are stored in a storage unit 30 (step S115, positional deviation detection unit 35). The alignment mark 19 is, for example, on the semiconductor chip 16 on the m-th step, and its coordinates are (Xm1a, Ym1a) and (Xm1b, Ym1b). The center coordinate (Xm1, Ym1) of (Xm1a, Ym1a) and (Xm1b, Ym1b) is stored as the mounting coordinate m1.

Next, it is determined whether the amount of positional deviation is within a predetermined range (step S116, positional deviation determination unit 36). When the amount of positional deviation is within the predetermined range, it is determined whether m equals the set number k (step S117). When m<k, m is incremented by 1 (step S118), and the processing after step S113 is repeated.

When it is determined in step S114 that the apparatus has stopped, the camera 12 recognizes the alignment mark 19 of the semiconductor chip 16 on the m-th step, and the coordinate (mounting coordinate m1) are stored in a storage unit 30 (step S119, positional deviation detection unit 35). In addition, in this step S119, the amount of positional deviation is calculated in the same manner as in step S115. In step S119, as in step S73 in FIG. 6, since the amount of positional deviation of the uppermost semiconductor chip 16 is calculated before evacuation, the amount of positional deviation can be calculated without being affected by the transport deviation.

Next, it is determined whether the amount of positional deviation is within a predetermined range (step S120, positional deviation determination unit 36). When it is determined in step S116 or S120 that the amount of positional deviation is not within the predetermined range, the group of semiconductor chips 20 which is being mounted as well as the support substrate 15 are evacuated by the transport unit 14 (step S121). Thereafter, predetermined warning processing is performed, and the apparatus performing the mounting processing is stopped (step S122). When it is determined in step S120 that the amount of positional deviation is within the predetermined range, the group of semiconductor chips 20 which is being mounted is evacuated by the transport unit 14 (step S123), and the apparatus is stopped (step S124).

Thereafter, it is determined whether to continue the mounting processing (step S125). When the mounting processing is not to be continued, the group of semiconductor chips 20 which is being mounted is transported out by the transport unit 14 (step S126), and the process ends.

When it is determined that the mounting processing is continued, the group of semiconductor chips 20 which is being mounted is returned to the position before evacuation by the transport unit 14 (step S127). Next, as shown in FIG. 12C, the alignment marks 21 on the lowermost semiconductor chip 16, the semiconductor chip 16 on the n-th step, or the support substrate 15 are recognized, and the coordinates thereof are stored in the storage unit 30 (step S128). The alignment mark 21 is disposed, for example, diagonally on the lowermost semiconductor chip 16 or the support substrate 15, and its coordinates are (Xn2'a, Yn2'a) and (Xn2'b, Yn2'b). The center coordinate (Xn2', Yn2') of (Xn2'a, Yn2'a) and (Xn2'b, Yn2'b) is stored as the reference coordinate n2'.

Next, the transport deviation amounts aa and ab between the coordinates (Xn2'a, Yn2'a) and (Xn2'b, Yn2'b) after returning the group of semiconductor chips 20 to the original position and the coordinates (Xn2a, Yn2a) and (Xn2b, Yn2b) of before evacuation are calculated (step S129). The transport deviation amounts are (Xαa=Xn2'a−Xn2a, Yαa=Yn2'a−Yn2a) and (Xαb=Xn2'b−Xn2b, Yαb=Yn2'b−Yn2b).

Next, the coordinates obtained by adding the transport deviation amounts αa and αb to the coordinates of the lowermost semiconductor chip 16 or the semiconductor chip 16 on the n-th step on the stage 11 are stored in the storage unit 30 (step S130). The coordinates are (Xn1'a=Xn1a+Xαa, Yn1'a=Yn1a+Yαa) and (Xn1'b=Xn1b+Xαb, Yn1'b=Yn1b+Yαb). The center coordinate (Xn1', Yn1') of (Xn1'a, Yn1'a) and (Xn1'b, Yn1'b) is stored as the corrected reference coordinate n1'.

Next, the reference coordinate n1 is replaced with the corrected reference coordinate n1' (step S131), and the processing after step S117 is performed.

As described above, in the sixth embodiment, the alignment marks 21 are disposed on the lowermost semiconductor chip 16 or the support substrate 15 so as not to be hidden by the group of stacked semiconductor chips 20, and with reference to the coordinates of the alignment marks 21, the amount of transport deviation when the group of semiconductor chips 20 is returned to its original position after evacuation is calculated. Thereby, it is possible to accurately detect the transport deviation amount. Even when the mounting processing is continued by returning the semiconductor chip group 20 to the original position after evacuation, it is possible to perform a stacking process with high accuracy with reference to the lowermost semiconductor chip 16 without being affected by the transport deviation.

Seventh Embodiment

In the above-described first to sixth embodiments, examples in which a plurality of semiconductor chips 16 are stacked on the support substrate 15 have been described. A stacked body in which a plurality of semiconductor chips 16 are stacked in advance may be mounted on the support substrate 15, or one or more semiconductor chips 16 are stacked on the stacked body. The support substrate 15 may be a substrate made of an organic or inorganic material having wiring, a support made of silicon, or a lead frame.

The present invention is also applicable to a case where a plurality of semiconductor chips 16 or a stacked body is mounted on an adhesive tape disposed on the support substrate 15 or the lead frame.

In the above-described first to sixth embodiments, an example is described in which only one group of semiconductor chips 20 in which a plurality of semiconductor chips 16 are stacked is mounted on the support substrate 15. The present invention is also applicable to a case where plural groups of semiconductor chips 20 are mounted on the support substrate 15. In this case, any stacking order of the plural groups of semiconductor chips 20 is applicable. For example, after the fabrication of one group of semiconductor chips 20 is completed, a process (Z direction priority process) of preparing the next group of semiconductor chips 20 may be repeated at another place. Alternatively, after the semiconductor chips 16 on the n-th step are sequentially mounted in a plurality of places, a process (XY direction priority process) of sequentially stacking the semiconductor chips 16 on the (n+1)-th step at a plurality of places is repeated.

In the fourth to sixth embodiments described above, in the case of employing the XY direction priority process, it is preferable that before evacuating the support substrate 15 together with the transport unit 14, the alignment marks 19 of all the uppermost semiconductor chips 16 be recognized by the camera 12, and its positions be stored.

Furthermore, in the flowcharts of FIGS. 6, 7 and 11 in the fourth to sixth embodiments, it is determined whether the apparatus has stopped. As in the case of FIG. 4, it may be determined whether a time elapsed after the semiconductor chip 16 has been transported onto the stage 11 is not less than the first set time, or whether the stage retention cumulative time is not less than the second set time.

Eighth Embodiment

A processing procedure for packaging a stacked body formed by stacking a plurality of semiconductor chips using the semiconductor manufacturing apparatus 1 according to the sixth embodiment will be described in more detail. FIG. 13 is a diagram for describing the eighth embodiment.

Figure 13A:
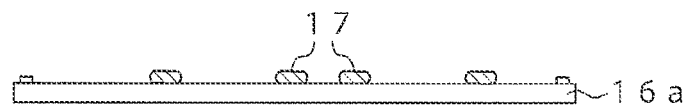
FIG. 13A is a view of the lowermost semiconductor chip arranged on a support substrate.

First, as shown in FIG. 13A, a lowermost semiconductor chip 16a disposed on the support substrate 15 is prepared. On this semiconductor chip 16a, an electrode pad 17 for stacking another semiconductor chip 16b are formed. The electrode pad 17 is made of a simple substance such as Al, Cu, Au, Ni, and Pd, composite materials thereof alloys thereof or the like. Further, a metal bump may be formed on the electrode pad 17. The metal bump is made of a simple substance such as Sn, Ag, Cu, Au, Bi, Zn, and In, composite materials thereof, alloys thereof or the like.

Figure 13B:
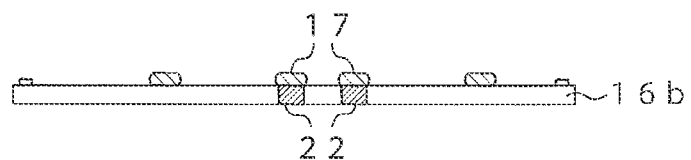
FIG. 13B is a view showing formation of a via penetrating the semiconductor chip arranged on the second step.

Next, as shown in FIG. 13B, a via (an opening) penetrating the semiconductor chip 16b is formed in the semiconductor chip 16b arranged in the second step. The opening is formed in the semiconductor chip 16b using a plasma device or the like, and SiO$_2$, SiN or the like is formed as an insulating film in the opening.

This insulating film may be a laminated film of SiO$_2$ and SiN. A via contact 22 made of a metal film is formed in the opening. The via contact 22 is formed by evaporation, sputtering, CVD, or the like using a simple substance such as Ti, Cr, Cu, Ni, Au, Pd, W, composite materials thereof, or alloys thereof. Next, the opening is metal plated with the metal film as a seed film. As the plating material, Cu, Ni, Pd, Au, Ag, or the like may be employed, and a composite material thereof or an alloy thereof may be employed.

Thereafter, the seed film is etched to form a pad. In the case of forming a metal bump on the pad, the opening may be plated with one kind of Sn, Ag, Cu, Au, Bi, Zn, In or the like or plural kinds of them in succession.

Electrode pad 17 are formed on the surface of the semiconductor chip 16b. The electrode pad is made of a simple substance such as Al, Cu, Au, Ni and Pd, composite films thereof, alloys thereof or the like. Further metal bumps may be formed on the electrode pad. The metal bump is made of Sn, Ag, Cu, Au, Bi, Zn, In, composite films thereof, or alloys thereof.

Figure 13C:
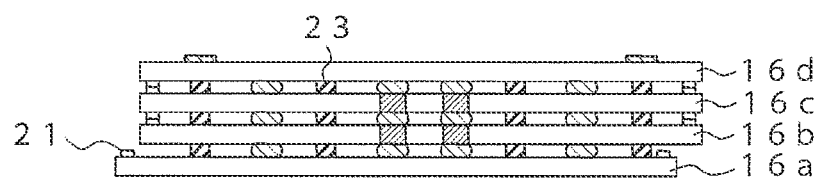
FIG. 13C is a diagram in which a semiconductor chip is mounted on a semiconductor chip.

Next, as shown in FIG. 13C, the semiconductor chip 16b is mounted on the semiconductor chip 16a. As described above, the semiconductor chip 16a has an electrode pad 17 and a bump to be electrically connected with the semiconductor chip 16a. Further, an adhesive 23 may be formed on the surface on which the semiconductor chip 16b is mounted. For the adhesive 23, a resin-like adhesive may be applied, or a film-like adhesive may be applied. A resin may be applied, exposed and developed. Similarly, the semiconductor chip 16c is stacked on the semiconductor chip 16b, and the semiconductor chip 16d is stacked in this order on the semiconductor chip 16c to form a stacked body 20.

Figure 13D:
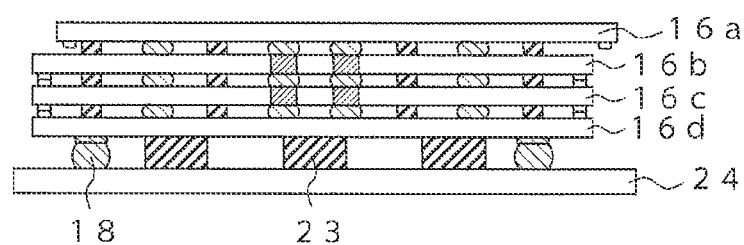
FIG. 13D is a diagram showing an example in which the stacked body is flip-chip mounted on a substrate 24 in an upside-down state.

Next, as shown in FIG. 13D, the stacked body 20 is flip-chip mounted on a substrate 24 in an upside-down state. A solder bump 18 is formed on the substrate 24. Also, the adhesive 23 is applied to the substrate 24. The adhesive 23 may be in the form of a resin or a film. The adhesive 23 may be applied to the stacked body 20. Thereafter, the stacked body 20 is flip-chip mounted on the substrate 24.

The pad 17 formed on the stacked body 20 and the solder bump 18 on the substrate are aligned and electrically connected. The solder bump 18 may be previously formed on the pad 17 of the stacked body 20.

The stacked body 20 on which the solder bump 18 are formed may be electrically connected with the electrode pad 17 of the substrate by being aligned with each other.

During flip-chip mounting, the temperature of the tool is increased, and the stacked body 20 and the substrate 24 are fixed to each other by the adhesive 23. The temperature at the time of flip-chip mounting may be raised to a temperature at which the solder is melted or at a temperature at which it does not melt.

Next, the substrate 24 on which the chip stacked body 20 is mounted is placed in a reducing atmosphere reflow furnace to electrically connect the metal bump 18 and the electrode pad 17. Reflow is performed in an atmosphere of hydrogen, formic acid or the like. The concentration of hydrogen or formic acid may be suitably diluted with nitrogen or the like. The temperature is raised to the melting point of the solder, and the semiconductor chips are connected with each other, and the chip stacked body are connected to the substrate. At this time, the substrate may be fixed using a jig so that it is not moved.

Figure 13E:
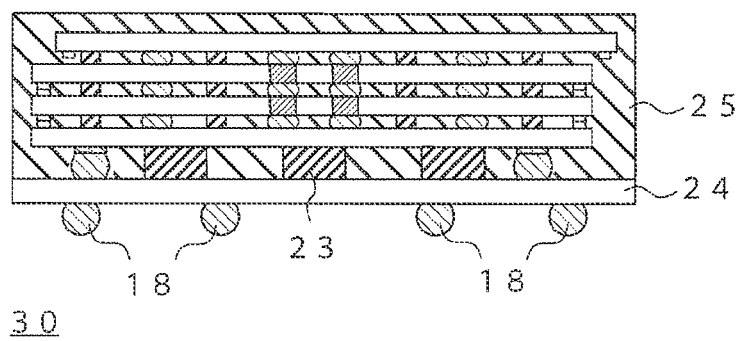
FIG. 13E is a diagram in which a resin is formed between each semiconductor chip of the chip stacked body 24 and in its surroundings.

Next, as shown in FIG. 13E, a resin 25 is formed between each semiconductor chip of a chip stacked body 24 and in their surroundings. The resin 25 may be a mold resin or an underfill material. The resin 25 may be placed between the semiconductor chips and between the chip stacked body 20 and the substrate 24 at the same time, or may be placed there in several divided times.

The lowermost semiconductor chip 16a in FIG. 13C may have a via penetrating the semiconductor chip 16a. Further, the stacked body 20 may be directly mounted on the semiconductor chip 16a.

When dicing from the wafer, the lowermost semiconductor chip 16a may be diced to be offset larger than the semiconductor chips 16b to 16d stacked on the semiconductor chip 16a. Alternatively, when dicing from the wafer, the lowermost semiconductor chip 16a may be set to be a reference size, and the semiconductor chips 16b to 16d may be diced to a size smaller than the reference size. Alternatively, a chip having a longer side size than the semiconductor chips 16b to 16d may be used as the semiconductor chip 16a. Alternatively, the semiconductor chips 16a to 16d may have the same size and only the lowermost semiconductor chip 16a may be shifted, whereby the semiconductor chips 16b to 16d can be stacked so that electrode pad 17 is not hidden by the semiconductor chips 16b to 16d.

The through via formed in the semiconductor chips 16b to 16d may be a front side via formed from the chip surface side or a back side via formed from the back side of the chip.

In this manner, the semiconductor device 30 manufactured by the process of FIGS. 13A to 13E includes n steps (n is an integer of 2 or more) of semiconductor chips 16. Each of the semiconductor chips 16 on the second and subsequent steps among the n steps of semiconductor chips includes a pad 17 for a connection with a lower semiconductor chip 16 by one step, and a first alignment mark 19 for aligning with the lower semiconductor chip 16 by one step, wherein the lowermost semiconductor chip has a second alignment mark 21 arranged so as not to vertically overlap with the stacked body of the n steps of semiconductor chips.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method of mounting a semiconductor chip or a stacked body of semiconductor chips on a support substrate placed on a stage, the method comprising:
   determining whether a mounting processing is stopped during the mounting processing of the semiconductor chip or the stacked body;
   evacuating, together with the support substrate, the semiconductor chip or the stacked body that has mounted on the support substrate before the determination when it is determined that the mounting processing is stopped;
   determining whether to resume the mounting processing of the semiconductor chip or the stacked body after the evacuation; and
   returning the evacuated semiconductor chip or the evacuated stacked body to a position before the evacuation and continuing the mounting processing when it is determined that the mounting processing is resumed.

2. The semiconductor manufacturing method according to claim 1,
   wherein the determining whether the mounting processing is stopped includes determining whether an apparatus performing the mounting processing stops, and
   wherein the evacuating the semiconductor chip or the stacked body includes evacuating the semiconductor chip or the stacked body when it is determined that the apparatus stops.

3. The semiconductor manufacturing method according to claim 1,
   wherein the determining whether the mounting processing is stopped comprises
   measuring a time elapsed after the support substrate on which the semiconductor chip or the stacked body is mounted has been transported onto a stage on which a mounting processing is performed or a time elapsed after the semiconductor chip or the stacked body has been mounted onto the stage, and
   determining whether the elapsed time is not less than a first set time,
   wherein the evacuating the semiconductor chip or the stacked body includes evacuating the semiconductor chip or the stacked body when it is determined that the elapsed time is not less than the first set time.

4. The semiconductor manufacturing method according to claim 3, further comprising:
   measuring a cumulative time for which the semiconductor chip or the stacked body has remained on the stage when it is determined that the mounting processing is resumed; and
   determining whether the cumulative time is within a second set time,
   wherein the continuing the mounting processing includes returning the semiconductor chip or the stacked body to a position before the evacuation and continuing the mounting processing when the cumulative time is within the second set time, and transporting the semiconductor chip or the stacked body out when the cumulative time exceeds the second set time.

5. The semiconductor manufacturing method according to claim 1,
   wherein the determining whether the mounting processing is stopped comprises
   measuring a time elapsed after the mounting processing has been stopped, and
   determining whether the elapsed time is not less than a first set time,
   wherein the evacuating the semiconductor chip or the stacked body includes evacuating the semiconductor chip or the stacked body when it is determined that the elapsed time is not less than the first set time.

6. The semiconductor manufacturing method according to claim 1,
   wherein the semiconductor chip or the stacked body comprises a group of semiconductor chips comprising a plurality of stacked semiconductor chips,
   wherein the method further comprises
   detecting an amount of positional deviation between a mounting coordinate on a semiconductor chip stacked last among the plurality of stacked semiconductor chips and a reference coordinate on a semiconductor chip stacked immediately before the semiconductor chip stacked last, and
   determining whether the amount of detected positional deviation is within a standard amount, and
   wherein when it is determined that the mounting processing stops, the evacuating the semiconductor chip or the stacked body includes evacuating the group of semiconductor chips after detecting the amount of positional deviation, and when the amount of detected positional deviation exceeds the standard amount, evacuating the group of semiconductor chips.

7. The semiconductor manufacturing method according to claim 1,
wherein the semiconductor chip or the stacked body comprises a group of semiconductor chips comprising m (m is an integer of 2 or more) semiconductor chips stacked,
wherein the method further comprises,
detecting an amount of positional deviation between a reference coordinate on a semiconductor chip stacked on a n-th step (n is an integer of 1 or more and less than m) and a mounting coordinate on a semiconductor chip stacked on a m-th step among the m stacked semiconductor chips, and
determining whether the amount of detected positional deviation is within a standard amount, and
wherein when it is determined that the mounting processing stops, the evacuating the semiconductor chip or the stacked body includes evacuating the group of semiconductor chips after detecting the amount of positional deviation, and when the amount of detected positional deviation exceeds the standard amount, evacuating the group of semiconductor chips and performing a predetermined warning processing.

8. The semiconductor manufacturing method according to claim 7,
wherein the continuing the mounting processing comprises detecting an amount of transport deviation between the mounting coordinate on the semiconductor chip stacked on the m-th step before the evacuation and the mounting coordinate on the semiconductor chip stacked on the m-th step returned to a position before the evacuation after the evacuation, correcting the reference coordinate on the semiconductor chip stacked on the n-th step based on the amount of transport deviation, and while detecting the amount of positional deviation between the corrected reference coordinate and the mounting coordinate on semiconductor chips stacked on the (m+1)-th and subsequent steps, stacking semiconductor chips on the (m+1)-th and subsequent steps based on the corrected reference coordinate.

9. The semiconductor manufacturing method according to claim 1,
wherein the semiconductor chip or the stacked body comprises a group of semiconductor chips comprising m (m is an integer of 2 or more) semiconductor chips stacked,
wherein a support substrate that supports the lowermost semiconductor chip on the stage among the group of semiconductor chips or the stacked body or the lowermost semiconductor chip comprises a first reference index provided at a position that is visible from above the support substrate when stacking the group of semiconductor chips,
wherein the lowermost semiconductor chip comprises a second reference index provided at a position that is not visible from above the support substrate when stacking the group of semiconductor chips, and
wherein the method further comprises
detecting coordinates of the first reference index and the second reference index,
detecting an amount of positional deviation between a mounting coordinate on the semiconductor chip stacked on the m-th step and a reference coordinate based on the second reference index, and
determining whether the amount of detected positional deviation is within a standard amount, and
wherein when it is determined that the mounting processing stops, the evacuating the semiconductor chip or the stacked body includes evacuating the group of semiconductor chips after detecting the amount of positional deviation, and when the amount of detected positional deviation exceeds the standard amount evacuating the group of semiconductor chips.

10. The semiconductor manufacturing method according to claim 9,
wherein the detecting the amount of positional deviation comprises when continuing the mounting processing after the evacuation, detecting an amount of transport deviation between a position of the first reference index before evacuation and a position of the first reference index after returning to the original position after the evacuation, correcting the reference coordinate based on the amount of transport deviation, and detecting an amount of positional deviation between the corrected reference coordinate and the mounting coordinate on semiconductor chips stacked on the (m+1)-th and subsequent steps.

* * * * *